United States Patent
Roper et al.

(10) Patent No.: US 10,775,748 B1
(45) Date of Patent: *Sep. 15, 2020

(54) ALKALI SOURCE AND/OR SINK USING ION-CONDUCTING SOLID ELECTROLYTE AND INTERCALATION-COMPOUND ELECTRODE

(71) Applicant: HRL Laboratories, LLC, Malibu, CA (US)

(72) Inventors: Christopher S. Roper, Oak Park, CA (US); Adam F. Gross, Santa Monica, CA (US); Matthew T. Rakher, Oxnard, CA (US); Logan D. Sorenson, Agoura Hills, CA (US); John J. Vajo, West Hills, CA (US); Jason A. Graetz, Calabasas, CA (US); Russell Mott, Calabasas, CA (US); Danny Kim, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/720,139

(22) Filed: Dec. 19, 2019

Related U.S. Application Data

(63) Continuation of application No. 15/639,391, filed on Jun. 30, 2017, now Pat. No. 10,545,461.

(60) Provisional application No. 62/401,459, filed on Sep. 29, 2016, provisional application No. 62/381,818, filed on Aug. 31, 2016.

(51) Int. Cl.
*G04F 5/14* (2006.01)
*H01P 7/06* (2006.01)
(Continued)

(52) U.S. Cl.
CPC .............. *G04F 5/145* (2013.01); *C22B 26/10* (2013.01); *H01P 7/06* (2013.01); *H03L 7/26* (2013.01)

(58) Field of Classification Search
CPC ... H03L 7/26; G04F 5/14; C22B 26/10; H01P 7/06
(Continued)

(56) References Cited

U.S. PATENT DOCUMENTS

| | | |
|---|---|---|
| 3,578,834 A | 5/1971 | Porta et al. |
| 4,495,478 A | 1/1985 | Kwon et al. |

(Continued)

FOREIGN PATENT DOCUMENTS

| | | |
|---|---|---|
| WO | 1997012298 A1 | 4/1997 |
| WO | 2000043842 A2 | 2/2001 |

OTHER PUBLICATIONS

Svenja Knappe, MEMS Atomic Clocks, National Institute of Standards and Technology (NIST), Boulder, CO, USA Published by Elsevier B.V., Comprehensive Microsystems, vol. 3, pp. 571-612, 2007.

(Continued)

*Primary Examiner* — Arnold M Kinkead
(74) *Attorney, Agent, or Firm* — O'Connor & Company

(57) ABSTRACT

Some variations provide an alkali metal or alkaline earth metal vapor cell with a solid ionic conductor and intercalable-compound electrodes. The intercalable-compound electrodes are used as efficient sources and/or as sinks for alkali metal or alkaline earth metal atoms, thus enabling electrical control over metal atom content in the vapor cell. Some variations provide a vapor-cell system comprising: a vapor-cell region configured to allow a vapor-cell optical path into a vapor-cell vapor phase; a first electrode; a second electrode electrically isolated from the first electrode, wherein the second electrode contains an intercalable compound intercalated by an element selected from Rb, Cs, Na, K, or Sr; and an ion-conducting layer between the first electrode and the second electrode. The ion-conducting (Continued)

layer is ionically conductive for at least one ionic species selected from $Rb^+$, $Cs^+$, $Na^+$, $K^+$, or $Sr^{2+}$. The intercalable compound is preferably a carbonaceous material, such as graphite.

20 Claims, 14 Drawing Sheets

(51) Int. Cl.
  *H03L 7/26* (2006.01)
  *C22B 26/10* (2006.01)
(58) Field of Classification Search
  USPC .......... 331/3, 94.1; 324/301, 305; 250/432 R
  See application file for complete search history.

(56) References Cited

U.S. PATENT DOCUMENTS

| | | | |
|---|---|---|---|
| 5,192,921 | A | 3/1993 | Chantry et al. |
| 8,009,520 | B2 | 8/2011 | Jau et al. |
| 8,258,884 | B2 | 9/2012 | Borwick, III et al. |
| 8,624,682 | B2 | 1/2014 | Ridley et al. |
| 8,999,123 | B2 | 4/2015 | Bernstein et al. |
| 9,064,942 | B2 | 6/2015 | Bangsaruntip et al. |
| 9,077,354 | B2 | 7/2015 | Strabley et al. |
| 9,685,483 | B2 | 6/2017 | Nazarian et al. |
| 9,837,177 | B1 * | 12/2017 | Roper ................ G04F 5/00 |
| 10,545,461 | B1 * | 1/2020 | Roper ................ C22B 26/10 |
| 2011/0247942 | A1 | 10/2011 | Bernstein et al. |
| 2014/0227548 | A1 | 8/2014 | Myrick |
| 2015/0226669 | A1 | 8/2015 | Compton |

OTHER PUBLICATIONS

Jonathan J. Bernstein et al., "All Solid-State Ion-Conducting Cesium Source for Atomic Clocks," Solid State Ionics, vol. 198, No. 1, Sep. 2011.

Bernstein et al., "Solid State Electrochemical Alkali Sources for Cold Atom Sensing", Solid-State Sensors, Actuators and Microsystems Workshop, Hilton Head Island, South Carolina, Jun. 5-9, 2016.

Wan et al., "Study on the First-Principles Calculations of Graphite Intercalated by Alkali Metal (Li, Na, K)", Int. J. Electrochem. Sci., 10 (2015) 3177-3184.

* cited by examiner

US 10,775,748 B1

ALKALI SOURCE AND/OR SINK USING ION-CONDUCTING SOLID ELECTROLYTE AND INTERCALATION-COMPOUND ELECTRODE

PRIORITY DATA

This patent application is a continuation application of U.S. Pat. No. 10,545,461, issued on Jan. 28, 2020, which claims priority to U.S. Provisional Patent App. No. 62/381,818, filed Aug. 31, 2016, and to U.S. Provisional Patent App. No. 62/401,459, filed Sep. 29, 2016, each of which is hereby incorporated by reference herein.

STATEMENT REGARDING FEDERALLY SPONSORED RESEARCH OR DEVELOPMENT

This invention was made with Government support under Contract No. N66001-15-C-4027 awarded by DARPA. The Government has certain rights in this invention.

FIELD OF THE INVENTION

The present invention generally relates to alkali and alkaline earth vapor cells, systems containing vapor cells, and methods of using vapor cells.

BACKGROUND OF THE INVENTION

Alkali vapor-cells have been used extensively since the 1960s in the study of light-atom interactions. Vapor-cell applications, both proposed and realized, include atomic clocks, communication system switches and buffers, single-photon generators and detectors, gas-phase sensors, nonlinear frequency generators, and precision spectroscopy instrumentation. However, most of these applications, and cold-atom systems in general, have only been created in laboratory settings.

Macroscale vapor cells are widely used in macroscale atomic clocks and as spectroscopy references. Macroscale vapor cells are typically 10-100 cm$^3$ in volume, which is insignificant for m$^3$ scale atomic clocks, but far too large for chip-scale atomic clocks which are at most a few cm$^3$ in volume.

A key driver has thus been to reduce vapor-cell size. Traditional vapor-cell systems are large and, if they have thermal control, have many discrete components and consume a large amount of power. To realize the full potential of vapor-cell technologies, the vapor-cell systems need to be miniaturized.

Chip-scale atomic clocks and navigation systems require miniature vapor cells, typically containing cesium or rubidium, with narrow absorption peaks that are stable over time. Miniature vapor cells, and methods of filling them with alkali metals, have been described in the prior art. However, it has proven difficult to load a precise amount of alkali metal into a miniature vapor cell through the methods described in the literature. Miniature vapor cells have higher surface-area-to-volume ratios than macroscale vapor cells, and are more difficult to load than macroscale vapor cells.

It is difficult to load a precise amount of alkali metal into a miniature vapor cell. Furthermore, the amount of alkali vapor in a vapor cell changes over time as the vapor adsorbs, diffuses, and reacts with the walls. Alkali metal vapor pressure may be changed with a small set of known technologies (see Monroe et al., *Phys Rev Lett* 1990, 65, 1571; Scherer et al., *J Vac Sci & Tech A* 2012, 30; and Dugrain, *Review of Scientific Instruments*, vol. 85, no. 8, p. 083112, August 2014). However, these systems are slow, complex, and/or have a short longevity.

A number of patents and patent applications discuss miniature vapor cells and methods of filling them with alkali metals. See U.S. Pat. No. 8,624,682 for "Vapor cell atomic clock physics package"; U.S. Pat. No. 8,258,884 for "System for charging a vapor cell"; U.S. Pat. No. 5,192,921 for "Miniaturized atomic frequency standard"; WO 1997012298 for "A miniature atomic frequency standard"; and WO 2000043842 for "Atomic frequency standard."

Traditionally, alkali metals have been introduced into magneto-optical trap (MOT) vacuum systems via difficult-to-control preparation steps, such as manually crushing a sealed alkali-containing glass ampule inside a metal tube connected to the vacuum system via a control valve. See Wieman, American *Journal of Physics*, vol. 63, no. 4, p. 317, 1995. This approach requires external heating to replenish the alkali metal inside the vacuum system as needed, which is a slow process with little control over the amount of alkali metal delivered. The manual labor is non-ideal for automated systems or chip-scale devices.

An alternative exists in the now-common alkali metal dispensers, which are effectively an oven-controlled source of alkali metal, whereby the desired alkali metal is released by chemical reaction when a current is passed through the device. While this process automates the release of alkali metal into the vacuum system, it has difficulty in fabrication compatibility with chip-scale cold-atom devices. Further, the timescales required for generating (warm up) and sinking (pump down) alkali are typically on the order of seconds to minutes, and can vary greatly depending on the amount of alkali metal built up on the vacuum system walls.

A rapidly pulsed and cooled variant of the alkali metal dispenser has been developed to stabilize the residual Rb vapor pressure in 100 millisecond pump-down time, but the device requires large-dimension Cu heat sinks and complicated thermal design (Dugrain, *Review of Scientific Instruments*, vol. 85, no. 8, p. 083112, August 2014) which may not easily translate to miniaturization.

Double MOTs wherein the first MOT is loaded at moderate vacuum, and then an atom cloud is transferred to a second high-vacuum MOT, have been implemented on the laboratory scale. Again, these systems require complicated dual-vacuum systems and controls as well as a transfer system to move the atom cloud from one MOT to the other, none of which is amenable to chip-scale integration.

Light-induced atomic desorption (LIAD) is a recent technique that solves some of the long pump-down times by only releasing a small amount of alkali using a desorption laser; however, this method requires preparing a special desorption target in the MOT vacuum chamber. The desorption laser can interfere with the trapping lasers of the MOT (see Anderson et al., *Physical Review A*, vol. 63, no. 2, January 2001). It also has yet to demonstrate suitable time constants below 1 second.

Thermoelectric stages can be used to regulate the overall temperature of the vapor cell, but this requires the addition of the thermoelectric stages, a temperature sensor and controller, and a significant amount of power (watts) to maintain the entire temperature of the cell at the correct temperature for MOT operation. The effectiveness of this approach will also depend on the overall size of the MOT cell and the efficiency of the thermoelectric stages, limiting the time constants at which the MOT can be loaded and the residual pressure stabilized.

Draper Laboratory has developed a solid-state ionic concept based on Cs conducting glass; see U.S. Pat. No. 8,999,123 and U.S. Patent App. Pub. No. 20110247942. However, the Draper technology has critical features. For example, the Cs conducting glass has low ion conductivity. The implications of this are shown in Bernstein et al., "All solid state ion-conducting cesium source for atomic clocks," *Solid State Ionics* Volume 198, Issue 1, 19 Sep. 2011, Pages 47-49, in which >1000 V applied voltage and elevated temperature (~170° C.) are required to change the alkali content on time scales of ~100 seconds.

What is instead desired is to work with much lower voltages (such as 1-100 V), lower temperatures (such as 25° C.), and preferably faster time response than 100 seconds. Cold atom lifetime is typically <1 second. The excess atoms should therefore be removed from the vapor chamber on response time scales<1 second in order to have a significant effect on the cold atom lifetime. In some applications, removing atoms from vapor cells on longer time scales is acceptable.

There is also a long-felt need for operation of cold atom systems at elevated temperatures. It has long been desirable to operate cold atoms systems at elevated temperature for precise timing and navigation applications, but the high equilibrium vapor pressure of the alkali metal vapors used at elevated temperatures leads to short lifetimes of the cold atoms (such as less than 1 millisecond), which reduces the stability of the measurement by orders of magnitude.

Draper Laboratory also reports using a thin gold film to enhance alkali transport. Because the diffusion coefficient of alkali atoms in gold is extremely slow, the gold film was made thin with the goal of achieving a porous film. This film only enhanced alkali transport rate by a factor of 2. Other researchers have found that gold can be a source and sink of alkali atoms (Squires, *High repetition rate Bose-Einstein condensate production in a compact, transportable vacuum system*, Ph.D. Thesis, University of Colorado, 2008). However, the alkali interaction with the gold is a surface effect due to the low diffusivity of alkali atoms in gold.

In Bernstein et al., "SOLID STATE ELECTROCHEMICAL ALKALI SOURCES FOR COLD ATOM SENSING," Solid-State Sensors, Actuators and Microsystems Workshop, South Carolina, June 2016 (pages 180-184), Draper Laboratory discloses the use of inert Pt electrodes with 130 V to reduce Rb vapor pressure using Rb-beta-alumina. This is a very high required voltage. Furthermore, the backside electrodes contain a metal that is ionized and injected into the solid electrolyte (e.g. Ag) that is different from the desired atoms in the vapor phase of the vapor cell (e.g. Cs or Rb). This contaminates the solid electrolyte and limits the usable lifetime for the device.

Graphite has been used as a sink for stray alkali atoms in atomic systems. Honeywell has employed heated graphite to control the vapor pressure of alkali atom vapor (U.S. Patent App. Pub. No. 20150226669). Using graphite in this manner does not make use of electrochemistry. Alkali atoms merely diffuse into and out of the graphite as the equilibrium vapor pressure of the alkali atom vapor changes, by changing the temperature of the graphite. There are a number of drawbacks to this approach:

1. The alkali vapor pressure is indirectly controlled through temperature.
2. The graphite must be thermally isolated from the rest of the cell, thus increasing device complexity.
3. Heating the graphite will require significant power, thus limiting portability.
4. Heating the device to the appropriate temperature will require temperature monitoring and feedback, which adds further complexity.

An atom chip is an arrangement of microfabricated current-carrying wires patterned on a substrate which is used to trap and control atoms via the strong magnetic field gradients offered at distances close to conductors. Atoms chips enable highly sophisticated experiments to be condensed into areas on the order of a few square centimeters and readily lend themselves to the miniaturization and integration of cold atom systems for practical applications beyond the laboratory.

Atom chips use metal traces patterned via lithographic techniques to create magnetic fields involved in trapping populations of atoms. See U.S. Pat. No. 7,126,112 for "Cold atom system with atom chip wall"; Fortagh et al., *Rev. Mod. Phys.* 79, 235 (2007) Reichel et al., *Atom Chips*, Wiley, 2011; and Treutlein, *Coherent manipulation of ultracold atoms on atom chips*, Dissertation, Ludwig-Maximilians-University Munich, 2008, which is hereby incorporated by reference. Atom chips typically are implemented as one wall of a vapor cell. Thus they suffer from the same issues—such as slow vapor pressure rate of change and loss of alkali vapor to the walls—as conventional vapor cells. Improvements to conventional vapor cells in which magnetic trapping fields are generated by magnets or electromagnets outside the vapor cell also apply to atom chips for which magnetic fields are generated by magnets or electromagnets inside the vapor cell.

SUMMARY OF THE INVENTION

The present invention addresses the aforementioned needs in the art, as will now be summarized and then further described in detail below.

Some variations provide a vapor-cell system comprising:

a vapor-cell region configured to allow at least one vapor-cell optical path into a vapor-cell vapor phase within the vapor-cell region;

a first electrode disposed in contact with the vapor-cell region, wherein the first electrode contains a first intercalable compound that is preferably intercalative for at least one element (in ionic and/or neutral form) selected from the group consisting of Rb, Cs, Na, K, and Sr;

a second electrode that is electrically isolated from the first electrode; and an ion-conducting layer interposed between the first electrode and the second electrode, wherein the ion-conducting layer is in ionic communication with the second electrode, and wherein the ion-conducting layer is ionically conductive for at least one ionic species selected from the group consisting of $Rb^+$, $Cs^+$, $Na^+$, $K^+$, and $Sr^{2+}$.

In some embodiments, the first intercalable compound is a carbonaceous material, such as a material selected from the group consisting of graphite, graphene, holey graphene, graphene platelets, carbon nanotubes, fullerenes, activated carbon, coke, pitch coke, petroleum coke, carbon black, amorphous carbon, glassy carbon, pyrolyzed carbon-containing molecules, pyrolyzed parylene, polyaromatic hydrocarbons, and combinations thereof. In certain embodiments, the carbonaceous material comprises graphite.

In other embodiments, the first intercalable compound is a transition-metal oxide, a transition-metal dichalcogenide, or a combination thereof. The first intercalable compound may also be a mixture of a carbonaceous material and a transition-metal oxide, or a mixture of a carbonaceous material and a transition-metal dichalcogenide, or a mixture of all of these materials.

The ion-conducting layer may contain at least one ionic species selected from the group consisting of $Rb^+$, $Cs^+$, $Na^+$, $K^+$, and $Sr^{2+}$, such as during device operation. The first intercalable compound may be intercalated by a neutral form of the ionic species, i.e., Rb, Cs, Na, K, and/or Sr.

The vapor-cell region may contain a vapor phase comprising metal atoms that are intercalable in the first intercalable compound. In some embodiments, the metal atoms (in the vapor phase) are selected from the group consisting of Rb, Cs, Na, K, Sr, and combinations thereof. In certain embodiments, the ion-conducting layer contains at least one ionic species selected from the group consisting of $Rb^+$, $Cs^+$, $Na^+$, $K^+$, and $Sr^{2+}$, and the metal atoms in the vapor phase are the same element as the selected ionic species.

In some embodiments, the ion-conducting layer comprises β-alumina, β"-alumina, yttria-stabilized zirconia, NASICON, LISICON, KSICON, or combinations thereof. The ion-conducting layer may be characterized by an ionic conductivity at 25° C. of about $10^{-7}$ S/cm or higher.

The second electrode may contain a second intercalable compound that is preferably intercalative for at least one element (in ionic and/or neutral form) selected from the group consisting of Rb, Cs, Na, K, and Sr. The second intercalable compound may be the same material as the first intercalable compound. Alternatively, the second intercalable compound may be a different material from the first intercalable compound.

In some embodiments, the second intercalable compound is a carbonaceous material, such as a material is selected from the group consisting of graphite, graphene, holey graphene, graphene platelets, carbon nanotubes, fullerenes, activated carbon, coke, pitch coke, petroleum coke, carbon black, amorphous carbon, glassy carbon, pyrolyzed carbon-containing molecules, pyrolyzed parylene, polyaromatic hydrocarbons, and combinations thereof.

In other embodiments, the second intercalable compound is a transition-metal oxide, a transition-metal dichalcogenide, or a combination thereof. The second intercalable compound may also be a mixture of a carbonaceous material and a transition-metal oxide, or a mixture of a carbonaceous material and a transition-metal dichalcogenide, or a mixture of all of these materials.

The second intercalable compound may be intercalated by a neutral form of at least one ionic species selected from the group consisting of $Rb^+$, $Cs^+$, $Na^+$, $K^+$, and $Sr^{2+}$. The vapor-cell region vapor phase may include metal atoms that are intercalable in the second intercalable compound.

The second electrode is typically not in contact with the vapor-cell region. Optionally, the second electrode is in contact with a reservoir region containing alkali or alkaline earth metal atoms, or other metal atoms.

In some embodiments, the vapor-cell system further includes a heater attached to the vapor-cell system, or in thermal or electromagnetic communication with the vapor-cell system.

In some embodiments, the vapor-cell system further comprises an atom chip. The system may include electrical traces physically located on, but electrically insulated from, the ion-conducting layer.

The vapor-cell system may be configured to allow three vapor-cell optical paths into the vapor-cell vapor phase. In certain embodiments, the three vapor-cell optical paths are orthogonal.

The present invention also provides a vapor-cell system comprising:

a vapor-cell region configured to allow at least one vapor-cell optical path into a vapor-cell vapor phase within the vapor-cell region;

a first electrode disposed in contact with the vapor-cell region, wherein the first electrode contains a first intercalation compound that is intercalated by at least one element, in ionic or neutral form, selected from the group consisting of Rb, Cs, Na, K, and Sr;

a second electrode that is electrically isolated from the first electrode, wherein the second electrode contains a second intercalation compound that is intercalated by the at least one element, in ionic or neutral form, selected from the group consisting of Rb, Cs, Na, K, and Sr; and an ion-conducting layer interposed between the first electrode and the second electrode, wherein the ion-conducting layer is in ionic communication with the second electrode, wherein the ion-conducting layer is ionically conductive for at least one ionic species selected from the group consisting of $Rb^+$, $Cs^+$, $Na^+$, $K^+$, and $Sr^{2+}$, wherein the ion-conducting layer contains mobile ions comprising the at least one ionic species.

The present invention also provides a magneto-optical trap apparatus, the apparatus comprising:

(a1) a vapor-cell region configured to allow three (preferably orthogonal) vapor-cell optical paths in a vapor-cell vapor phase within the vapor-cell region;

(a2) a first electrode disposed in contact with the vapor-cell region, wherein the first electrode contains a first intercalation compound that is intercalated by at least one element, in ionic or neutral form, selected from the group consisting of Rb, Cs, Na, K, and Sr;

(a3) a second electrode that is electrically isolated from the first electrode, wherein the second electrode contains a second intercalation compound that is intercalated by the at least one element, in ionic or neutral form, selected from the group consisting of Rb, Cs, Na, K, and Sr;

(a4) an ion-conducting layer interposed between the first electrode and the second electrode, wherein the ion-conducting layer is in ionic communication with the second electrode, wherein the ion-conducting layer is ionically conductive for at least one ionic species selected from the group consisting of $Rb^+$, $Cs^+$, $Na^+$, $K^+$, and $Sr^{2+}$, wherein the ion-conducting layer contains mobile ions comprising the at least one ionic species;

(b) optionally a source of laser beams configured to provide three orthogonal vapor-cell optical paths through the vapor-cell vapor phase, to trap a population of cold atoms; and (c) optionally a magnetic-field source configured to generate magnetic fields within the vapor-cell region.

The present invention also provides an atomic-cloud imaging apparatus, the apparatus comprising:

(a1) a vapor-cell region configured to allow three (preferably orthogonal) vapor-cell optical path into a vapor-cell vapor phase within the vapor-cell region;

(a2) a first electrode disposed in contact with the vapor-cell region, wherein the first electrode contains a first intercalation compound that is intercalated by at least one element, in ionic or neutral form, selected from the group consisting of Rb, Cs, Na, K, and Sr;

(a3) a second electrode that is electrically isolated from the first electrode, wherein the second electrode contains a second intercalation compound that is intercalated by the at least one element, in ionic or neutral form, selected from the group consisting of Rb, Cs, Na, K, and Sr;

(a4) an ion-conducting layer interposed between the first electrode and the second electrode, wherein the ion-conducting layer is in ionic communication with the second electrode, wherein the ion-conducting layer is ionically conductive for at least one ionic species selected from the group consisting of $Rb^+$, $Cs^+$, $Na^+$, $K^+$, and $Sr^{2+}$, wherein the ion-conducting layer contains mobile ions comprising the at least one ionic species;

(b) optionally a source of laser beams configured to provide three orthogonal vapor-cell optical paths through the vapor-cell vapor phase, to image a population of cold atoms; and (c) optionally a magnetic-field source configured to generate magnetic fields within the vapor-cell region.

DETAILED DESCRIPTION OF EMBODIMENTS OF THE INVENTION

Figure 1A:
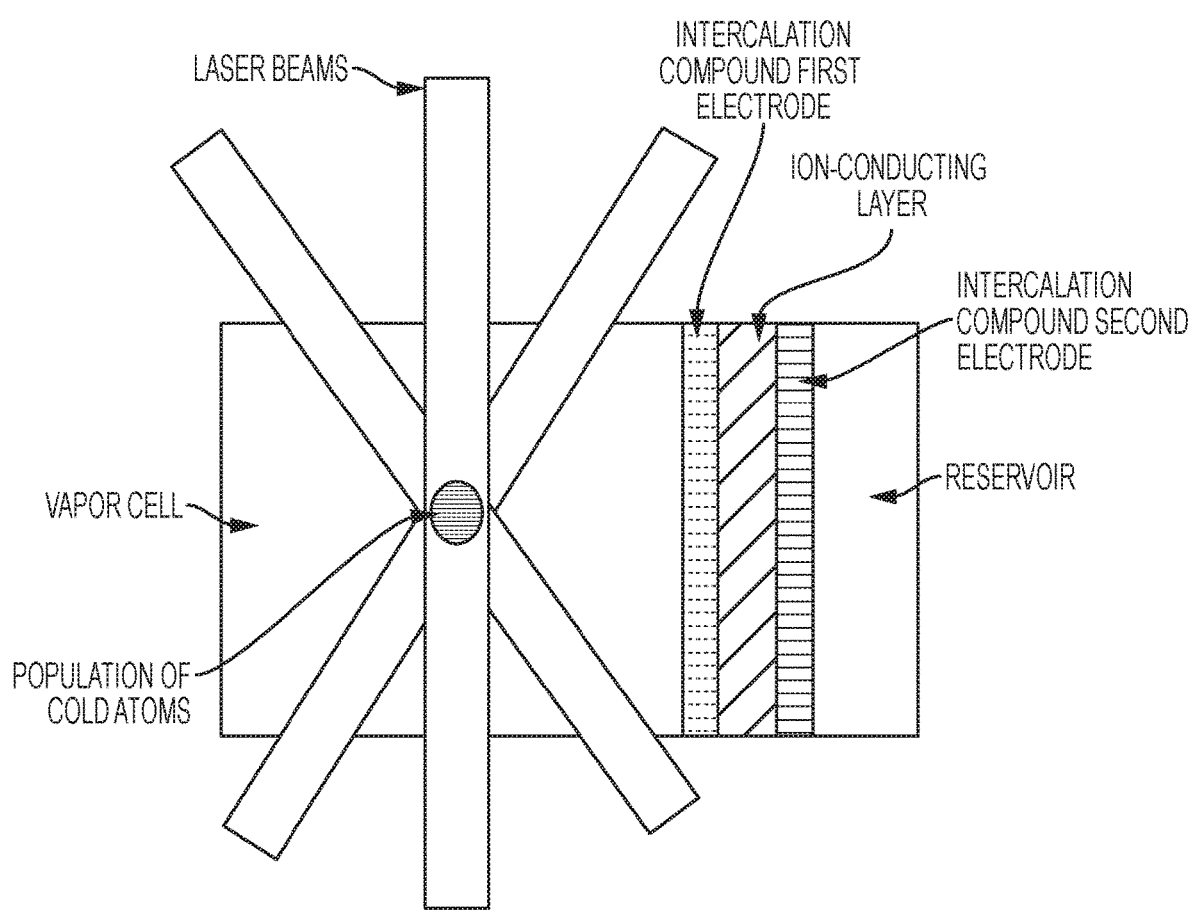
FIG. 1A is a schematic of an exemplary vapor cell, in some embodiments, with a single-layer intercalable-compound first (front) electrode disposed in contact with the vapor-cell region.

The structures, systems, and methods of the present invention will be described in detail by reference to various non-limiting embodiments.

This description will enable one skilled in the art to make and use the invention, and it describes several embodiments, adaptations, variations, alternatives, and uses of the invention. These and other embodiments, features, and advantages of the present invention will become more apparent to those skilled in the art when taken with reference to the following detailed description of the invention in conjunction with the accompanying drawings.

As used in this specification and the appended claims, the singular forms "a," "an," and "the" include plural referents unless the context clearly indicates otherwise. Unless defined otherwise, all technical and scientific terms used herein have the same meaning as is commonly understood by one of ordinary skill in the art to which this invention belongs.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phrase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" limits the scope of a claim to the specified elements or method steps, plus those that do not materially affect the basis and novel characteristic(s) of the claimed subject matter.

With respect to the terms "comprising," "consisting of," and "consisting essentially of," where one of these three terms is used herein, the presently disclosed and claimed subject matter may include the use of either of the other two terms. Thus in some embodiments not otherwise explicitly recited, any instance of "comprising" may be replaced by "consisting of" or, alternatively, by "consisting essentially of."

Some variations of this invention are premised on an alkali metal or alkaline earth metal vapor cell with a solid electrolyte ionic conductor (e.g. beta-alumina) and intercalable-compound (e.g. graphite) electrodes. The intercalable-compound electrodes are used as sources and/or as sinks for alkali metal or alkaline earth metal atoms, thus enabling electrical control over alkali or alkaline earth content of the vapor cell. The intercalable-compound electrodes enable orders-of-magnitude enhanced alkali or alkaline earth metal flux.

Previous devices proposed for controlling alkali vapor pressure using solid electrolytes have employed inert electrodes, typically as interconnected platinum lines. The electrochemical reaction in such devices requires the transport of three distinct species (alkali ions, electrons, and alkali neutral atoms), each of which can transport only in one of three layers (the solid electrolyte, the electrode, and the vapor phase, respectively). The electrochemical reaction can only occur at edges of the inert electrode lines where these three phases meet. Because surface diffusion of alkali metals is slow at typical alkali vapor cell temperatures (e.g. for atomic clocks and gyroscopes), the actual active area of a device is orders of magnitude less than the area of the solid electrolyte.

By contrast, graphite (as an exemplary intercalation compound) both conducts electrons and provides a high diffusivity of alkali atoms due to intercalation, i.e. the formation of intercalation compounds of the alkali atoms. By using a blanket graphite electrode, for example, the electrochemical reaction occurs across a plane instead of at a line, thus allowing substantially more of the electrolyte surface to be actively involved in the reaction. This results in orders-of-magnitude faster alkali vapor sourcing and sinking performance.

The primary purpose of this invention is to directly and precisely control the vapor pressure of alkali atoms or other metal atoms. Electrical inputs enable controlled dosing of metal atoms (e.g., alkali atoms) into and out of a vapor cell. The ability to control the vapor pressure in vapor cells has multiple applications, mainly related to atomic physics.

For instance, the ability to control the vapor pressure of alkali atoms can enable long population lifetimes of cold atoms, particularly in miniaturized atomic systems. Cold atoms (such as at temperatures of about 1 µK to about 1 K, typically from about 100 µK to about 1000 µK) are useful for precision timing and navigation applications. In certain applications, cold atoms can be made that are in the nanokelvin range or even less ($\leq 10^{-9}$ K).

Cold atoms are typically formed from a subset of warmer atoms inside a vapor cell, e.g. through trapping and cooling in a magneto-optical trap (MOT). The time constant of the cold-atom population depends on the density of other atoms in the vapor cell because of collisional heating. For fast loading (i.e. short time constant on loading), it is desirable to have a high vapor density of atoms. However, for highly stable and highly precise measurement, it is desirable to have the population of cold atoms last as long as possible. Therefore it is desirable to have a long time constant and low vapor density once the population of cold atoms has been cooled and trapped. The active control of the vapor density in a vapor cell, provided in this patent application, enables a fast loading time as well as a long lifetime.

Additionally, the ability to source alkali atoms with low power and with the emission of no other chemical species is desirable. Conventional alkali sources require high currents ($\geq 5$ A is typical) and high power (e.g., Società Apparecchi Electrici e Scientifici (SAES) Getters, Milan, Italy). For portable battery-powered atomic clock applications, a power budget of watts will yield device lifetimes so short as to be impractical. Furthermore, SAES alkali sources emit non-alkali gases in their initial period of operation. For a system connected to a vacuum pump, this is often not a concern. However, for portable atomic physics systems that are infrequently or never serviced, non-alkali gases can shift or broaden the atomic transition frequency and/or increase the vapor cell pressure high enough to prevent the formation of a population of cold atoms.

Variations of this invention enable active, bidirectional control of alkali metal and alkaline earth metal vapor pressure within a vapor cell. This invention is applicable to portable and highly-precise position, navigation, and timing systems. Further, combining this invention with atom chips having dynamic control of vapor pressure allows device miniaturization.

For convenience, "alkali" or "alkali metal" may be used in this specification to refer to one or more alkali metals, one or more alkaline earth metals, or a combination thereof. Alkali metals include Li, Na, K, Cs, Rb, or Fr. Alkaline earth metal include Be, Mg, Ca, or Sr, Ba, and Ra.

Also, "source," "sink," "source and/or sink", "source/sink" or the like may be used herein to refer to a source of alkali metals and/or alkaline earth metals; a sink of alkali metals and/or alkaline earth metals; or a material or structure that acts as either a source or sink of alkali metals and/or alkaline earth metals, depending on local conditions (e.g., temperature, pressure, or electrical potential), concentrations of species, etc.

Within the vapor chamber volume, the vapor chamber contains an atomic vapor, preferably that of an alkali metal or an alkaline earth metal. The atomic vapor may generally contain any atomic metal, including mercury (Hg) or rare earth metals (e.g., Yb, Ce, Nd, Sc, or Y).

Optionally, the atomic vapor is isotopically enriched or purified. When the alkali or alkaline earth metal is isotopically enriched, the relative abundance of the isotopes of a given element are altered, thus producing a form of the element that has been enriched in one particular isotope and depleted in its other isotopic forms. The alkali or alkaline earth metal may be isotopically pure, which means it is composed entirely of one isotope of the selected alkali or alkaline earth metal.

In some embodiments, the vapor chamber contains nothing but the atomic vapor as a rarefied gas, i.e. the vapor chamber is under partial vacuum.

In other embodiments, the vapor chamber contains additional gases in addition to the atomic vapor. Additional gases may be selected from $N_2$, $CH_4$, He, Ar, Ne, Xe, $NH_3$, $CO_2$, $H_2O$, $H_2$, or mixtures of these or other molecules, for example. Non-metal atoms (e.g., elemental H, N, or O) may also be used as additional gases. The other gas or gases may be used as a buffer gas or as spin exchange gas, for example. Optionally, the other gas or gases may be isotopically enriched or purified. Any additional gas is preferably not reactive with the alkali or alkaline earth metal.

The vapor chamber may be hermetically sealed. The vapor chamber may also be configured in fluid communication with a larger system, which may or may not be collectively (with the vapor chamber) hermetically sealed. The larger system, for example, could be part of a high-vacuum system containing pumps, pressure/vacuum gauges, atom dispensers, getters, getter pumps, getter sources, pill sources, etc.

One or more walls of the vapor chamber volume are at least partially transparent, and preferably substantially transparent, at relevant wavelengths such that there is at least one optical path through the vapor cell volume. It is preferred that the optical path(s) go through the vapor cell, that is, from one wall to another wall. In some embodiments, a laser beam may enter the vapor cell, reflect off a mirrored surface inside the cell, and leave the cell through the same side that it entered.

An "optical path" is the path of a spectroscopic probing beam of light (or other type of laser beam) into the alkali or alkaline earth vapor-cell region, or in some cases, into a reservoir region. The optical path is optional in the sense that the device itself does not inherently include the beam of light, while operation of the device will at least periodically mean that an optical path is traversing into or through the alkali or alkaline earth vapor-cell region. Also note that an optical path is not necessarily a straight line. Internal reflectors may be included in the system, so that optical reflection occurs. In that case, the optical beam could enter and exit along the same wall (detection probe on the same side as the laser source), for example.

Walls enclose the vapor-cell region, sealing it from the ambient environment. The walls may be fabricated from silicon, $SiO_2$, fused silica, quartz, pyrex, metals, dielectrics, or a combination thereof, for example. At least one of the walls includes a substantially transparent portion such that there is an optical path through the vapor-cell region. A wall can be made transparent either by fabricating from an optically transparent material, or by including an optical window in a part of the wall.

Some variations provide a vapor-cell system comprising:

a vapor-cell region configured to allow at least one vapor-cell optical path into a vapor-cell vapor phase within the vapor-cell region;

at least one first electrode disposed in contact with the vapor-cell region, wherein the first electrode contains a first intercalable compound that is preferably intercalative for at least one element (in ionic and/or neutral form) selected from the group consisting of Rb, Cs, Na, K, and Sr;

at least one second electrode that is electrically isolated from the first electrode; and an ion-conducting layer interposed between the first electrode and the second electrode, wherein the ion-conducting layer is in ionic communication with the second electrode, and wherein the ion-conducting layer is ionically conductive for at least one ionic species selected from the group consisting of $Rb^+$, $Cs^+$, $Na^+$, $K^+$, and $Sr^{2+}$.

By "electrically isolated" it is meant that the second electrode is not in direct electrical contact with the first electrode, but electrical communication is possible through an external circuit. Also, the first and second electrodes are not electron-connected nor hole-connected, but are ion-connected, via the ion-conducting layer.

By "ionic communication" between the ion-conducting layer and the second electrode, it is meant that ions, or their neutral forms, are capable of being transported between the ion-conducting layer and the second electrode. Note that ions (i.e. positively or negatively charged atoms) may be neutralized at the interface between the ion-conducting layer and the second electrode, so that ions (e.g., as $Rb^+$ or $Na^+$) do not leave the ion-conducting layer. Rather, neutralized forms of the ions (e.g., Rb or Na) are transported away from the ion-conducting layer.

The first electrode is in contact with both the ion-conducting layer and the vapor chamber volume. Both the first electrode and the ion-conducting layer may form part of the inner walls of the vapor chamber. The first electrode preferably has a high diffusivity for alkali and/or alkaline earth metal atoms (or other atoms in the vapor cell). This "diffusivity" includes intercalation and any other mass-transport mechanisms involved. The atoms in the atomic vapor have a diffusivity in the first electrode that is preferably at least $10^{-10}$ $cm^2/s$ and more preferably at least $10^{-6}$ $cm^2/s$ at the device operation temperature (e.g., 25° C.). In various embodiments, atoms in the atomic vapor have a diffusivity in the first electrode of about $10^{-8}$ $cm^2/s$, $10^{-7}$ $cm^2/s$, $10^{-6}$ $cm^2/s$, $10^{-5}$ $cm^2/s$, $10^{-4}$ $cm^2/s$, or higher.

The first electrode comprises an intercalable compound. As used herein, an "intercalable compound" (or "intercalatable compound") is a host material that is capable of forming an intercalation compound with guest atoms which comprise the atomic vapor in the vapor cell. Stated another way, the intercalable compound is intercalative for (capable of intercalating) at least some of the atoms in the atomic vapor. The guest atoms that are intercalated may be neutral atoms, ionic species, or a combination thereof. Typically, the guest atoms are intercalated as neutral atoms.

In some embodiments, the host material actually contains the guest species, resulting in a material which may be referred to as an "intercalation compound." It is noted that for the purposes of this patent application, any reference (e.g., in the drawings) to intercalable compound may be replaced by intercalation compound, and vice-versa, since an intercalable compound must be capable of intercalating a guest species but may or may not actually contain the intercalated guest species.

"Intercalation" herein is not limited to the reversible inclusion or insertion of an atom, ion, or molecule sandwiched between layers present in a compound, which shall be referred to herein as "layer intercalation." Intercalation also includes absorption of neutral atoms or ionic species into a bulk phase of the compound, whether that phase is amorphous or crystalline; adsorption of neutral atoms or ionic species onto an outer surface or an internal surface (e.g., a phase boundary) present in the compound; and reversible chemical bonding between the neutral atoms or ionic species, and the compound.

Some preferred embodiments of the invention utilize layer intercalation, in which a guest species such as K expands the van der Waals gap between sheets of a layered compound such as graphite. This layer expansion requires energy. Without being limited by theory, the energy may be supplied by electrical current to initiate charge transfer between the guest (K) and the host solid (C, graphite). In this example, potassium graphite compounds such as $KC_8$ and $KC_{24}$ may be formed. These compounds are reversible, so that when the electrical current is adjusted, the potassium graphite compounds may give up the intercalated atoms (K). Those previously intercalated atoms may be released into the vapor phase or into the ion-conducting layer, for example. Electrical energy may be supplied to cause a chemical potential change at the interface with the intercalable compound, which then causes layer expansion.

In some embodiments, the first intercalable compound is a carbonaceous material, such as a material selected from the group consisting of graphite, graphene, holey graphene, graphene platelets, carbon nanotubes, fullerenes, activated carbon, coke, pitch coke, petroleum coke, carbon black, amorphous carbon, glassy carbon, pyrolyzed carbon-containing molecules, pyrolyzed parylene, polyaromatic hydrocarbons, and combinations thereof.

The carbonaceous material may be at least 50 wt % carbon, preferably at least 75 wt % carbon, more preferably at least 90 wt % carbon, most preferably at least 95 wt % carbon. In some embodiments, the carbonaceous material is essentially pure carbon, except for impurities. The carbonaceous material may include mesoporous carbon, microporous carbon, nanoporous carbon, or a combination thereof.

The first intercalable compound may be a form of predominately $sp^2$ bonded carbon. Examples of $sp^2$ bonded carbon include, but are not limited to, graphite, graphene, carbon nanotubes, carbon fibers, fullerenes (e.g. $C_{60}$ or $C_{70}$), pyrolyzed carbon-containing molecules or polymers (such as pyrolyzed parylene, e.g. parylene-N, parylene-C, or parylene-AF-4), and large polyaromatic hydrocarbons (e.g. pentacene, rubrene, hexabenzocoronene, or coronene). In the case of graphene (which is essentially a single layer of graphite), the graphene may be monolayer graphene or multiple layers of graphene. Graphene flakes (a few layers of graphene) may be utilized. Certain embodiments utilize monolayer holey graphene or multiple layers of holey graphene. Certain embodiments utilize graphene platelets.

In certain embodiments, the carbonaceous material comprises graphite. In contrast to the dense face-centered cubic (FCC) crystal structure of gold which leads to low diffusivities, graphite provides much higher diffusivity. Graphite consists of planes of carbon sheets. Alkali atoms readily intercalate between these carbon sheets, leading to a diffusivity (for alkali atoms) that is orders of magnitude higher than gold or other metals. Graphite electrodes in the present invention enable fast alkali transport at low voltages and low power consumption per atom removed.

Since the first electrode must function as an electrically conductive material (see below), graphite is a preferred material because it also transports not only atoms via intercalation, but also electricity due to the electron delocalization within the carbon layers. Valence electrons in the carbon are free to move, thereby conducting electricity through the graphite.

The graphite may be natural graphite (e.g., mined graphite) or synthetic graphite produced from various techniques. For example, graphite may be obtained from chemical-vapor-deposited graphitic carbon, carbide-derived graphite, recycled graphite, waste from graphene manufacture, and so on. Crystalline flake graphite occurs as isolated, flat, plate-like particles with hexagonal edges if unbroken; when broken the edges can be irregular or angular. Amorphous graphite is very fine flake graphite. Lump graphite occurs in fissure veins or fractures and appears as massive platy intergrowths of fibrous or acicular crystalline aggregates. Highly oriented pyrolytic graphite is graphite with an angular spread between the graphite sheets of less than 1°.

The graphite may be crystalline, amorphous, or a combination thereof. The graphite crystallinity may range from about 10% to about 90%, for example. A mixture of crystalline and amorphous graphite may be beneficial for intercalation not only between crystal layers but also between crystalline and amorphous regions of the graphite. With too much crystallinity, the diffusivity becomes highly anisotropic. If highly crystalline (i.e. highly anisotropic) graphite is oriented with the low-diffusivity axis normal to the surface of the device (which is a typical orientation), reduced alkali flux, and thus reduced performance, would result.

Functionalized carbon, such as graphite oxide or graphene oxide, may be employed in the first intercalable compound.

In other embodiments, the first intercalable compound is a transition-metal oxide, a transition-metal dichalcogenide, or a combination thereof. The first intercalable compound may also be a mixture of a carbonaceous material and a transition-metal oxide, or a mixture of a carbonaceous material and a transition-metal dichalcogenide, or a mixture of all of these materials. Specifically, the first intercalable compound may be a metal dichalcogenide selected from $MoS_2$, $TaS_2$, $TiTe_2$, or any other transition metal dioxide, disulfide, diselenide, or ditelluride.

The first electrode is at least a fair electrical conductor. In particular, the electrical resistivity of the first electrode is preferably less than about 10 k$\Omega$·cm, more preferably less than about 1 k$\Omega$·cm, and most preferably less than about 1 $\Omega$·cm measured at 25° C. In various embodiments, the electrical resistivity of the first electrode is about, or less than about, 1000 $\Omega$·cm, 100 $\Omega$·cm, 10 $\Omega$·cm, 1 $\Omega$·cm, or 0.1 $\Omega$·cm, measured at 25° C.

The first electrode may be a uniform layer (e.g., FIG. 1A) or a non-uniform layer. The thickness of the first electrode is preferably less than 100 µm and more preferably less than 10 µm. In some embodiments, the thickness of the first electrode is about 100 nm or less, about 10 nm or less, such as about 1 nm. In various embodiments, the thickness of the first electrode is about 1 nm, 10 nm, 100 nm, 1 µm, µm, 100 µm, or more.

In some embodiments, the first electrode is fabricated from particles of an intercalable compound dispersed in a matrix. The matrix may be a polymer binder, such as polyvinylpyrrolidone, cellulose resin, fluoroelastomer, or polyacrylic. The polymer binder preferably has low outgassing potential and is compatible with ultra-high vacuum. Optionally, additives may be introduced into the matrix to increase the electrical conductivity of the first electrode. Such additives may be metals or small conductive carbon particles (e.g. Super-P® Conductive Carbon Black).

The first electrode may also comprise a region and/or layer with high electrical conductivity, to minimize sheet resistance of the first electrode. For example, the first electrode may include two layers—a layer that is substantially graphite (or another material listed above) and a layer that is a porous, highly electrically conductive layer. The highly electrically conductive layer preferably has an electrical resistivity less than $10^{-3}$ $\Omega$·cm, more preferably less than $10^{-4}$ $\Omega$·cm, measured at 25° C. In various embodiments, the electrical resistivity of the highly electrically conductive layer is about, or less than about, $10^{-2}$ $\Omega$·cm, $10^{-3}$ $\Omega$·cm, $10^{-4}$ $\Omega$·cm, $10^{-5}$ $\Omega$·cm, or $10^{-6}$ $\Omega$·cm, measured at 25° C.

The optional porous highly electrically conductive layer may be a thin (e.g., less than 200 nm) Pt mesh. This may allow the desirable property that an electrical potential, when applied, does not vary considerably (e.g., <0.1 V) across the electrode surface even if the intercalable material has mediocre electrical conductivity or if the intercalable material is very thin (e.g., graphene). Other exemplary materials for the optional porous highly electrically conductive layer include, but are not limited to, Mo, W, and Al. The highly electrically conductive layer may also include more than one layer, such as a Ti adhesion layer and a Pt layer.

The highly electrically conductive layer preferably does not chemically interact with the ionic species. That is, the highly electrically conductive layer preferably does not form an intermetallic phase and does not chemically react with the ionic species. The highly electrically conductive layer preferably does not chemically interact with the ion-conducting layer; portions of the first electrode should not form mobile ions within ion-conducting layer.

The first electrode may be designed to have a large amount of three-phase contact length or interfacial contact area. The three phases are electrode, ionic conductor, and atomic vapor. Configurations that may accomplish high three-phase contact include a high-density mesh or grid pattern, a porous material with an open porosity, a high-density parallel line pattern, or a nanowire array, for example. Some of these configurations (e.g., mesh pattern) are enabled by including the highly electrically conductive layer, while other configurations (e.g., porous material or nanowires) may be accomplished with the intercalable material alone (e.g., carbon nanotubes).

The ion-conducting layer preferably has high ionic conductivity for an ionic species. The ionic species is preferably an ion of the atomic vapor in the vapor cell. The ionic species is preferably an alkali metal or alkaline earth metal ion, such as (but not limited to) one or more of $Na^+$, $K^+$, $Rb^+$, $Cs^+$, or $Sr^{2+}$. In certain embodiments, the ionic species is an ion of another metal, such as $Hg^{2+}$.

The ionic conductivity, measured at 25° C., is preferably about $10^{-7}$ S/cm or higher, more preferably about $10^{-5}$ S/cm or higher. In various embodiments, the ionic conductivity of the ion-conducting layer at 25° C. is about $10^{-8}$ S/cm, $10^{-7}$ S/cm, $10^{-6}$ S/cm, $10^{-5}$ S/cm, $10^{-4}$ S/cm, $10^{-3}$ S/cm, or $10^{-2}$ S/cm.

The ion-conducting layer is preferably a solid electrolyte. For example, the ion-conducting layer may be a large fraction (>50% by weight) β-alumina, β″-alumina, or a combination of β-alumina and β″-alumina. β-alumina and β″-alumina are good conductors of their mobile ions yet allows negligible non-ionic (i.e., electronic) conductivity. β″-alumina is a hard polycrystalline or monocrystalline ceramic which, when prepared as an electrolyte, is complexed with a mobile ion, such as $Na^+$, $K^+$, $Li^+$, or an ionic version of the alkali or alkaline earth metal. β-alumina and/or β″-alumina are also referred to herein as "beta-alumina." Beta-alumina solid electrolyte is a fast ion-conductor material used as a membrane in several types of electrochemical cells. Other possible solid electrolyte materials for the ion-conducting layer include yttria-stabilized zirconia, NASICON, LISICON, KSICON, and combinations thereof. Beta-alumina and other hygroscopic ionic conductors preferably do not contact humid air.

The second (back) electrode must not be in direct electrical contact with the first electrode. The second electrode is in direct or indirect contact with the ion-conducting layer. The second electrode is typically not in physical contact with the vapor-cell region. Optionally, the second electrode is in contact with a reservoir region containing alkali or alkaline earth metal atoms, or other metal atoms. Each electrode is typically connected to an electrical lead.

The second electrode may be fabricated from common electrode materials including, but not limited to, Pt, Mo, W, Ni, Cu, Fe, and Al. The second electrode may be solid or porous.

In some embodiments, the second electrode contains a second intercalable compound that is capable of being intercalated by at least one element (in ionic and/or neutral form) selected from the group consisting of Rb, Cs, Na, K, and Sr. The second intercalable compound may be the same material as the first intercalable compound. Alternatively, the second intercalable compound may be a different material from the first intercalable compound.

The second intercalable compound may be a carbonaceous material, such as a material is selected from the group consisting of graphite, graphene, carbon nanotubes, fullerenes, activated carbon, coke, pitch coke, petroleum coke, carbon black, amorphous carbon, glassy carbon, pyrolyzed carbon-containing molecules, pyrolyzed parylene, polyaromatic hydrocarbons, and combinations thereof.

In other embodiments, the second intercalable compound is a transition-metal oxide, a transition-metal dichalcogenide, or a combination thereof. The second intercalable compound may also be a mixture of a carbonaceous material and a transition-metal oxide, or a mixture of a carbonaceous material and a transition-metal dichalcogenide, or a mixture of all of these materials.

The second intercalable compound may be intercalated by a neutral form of at least one ionic species selected from the group consisting of $Rb^+$, $Cs^+$, $Na^+$, $K^+$, and $Sr^{2+}$. The vapor-cell region vapor phase may include metal atoms that are intercalable in the second intercalable compound.

In some embodiments, the second electrode includes more than one layer, such as a Ti adhesion layer and a Pt layer, or a Cu layer and a graphite layer, for example.

It is desirable that an electrical potential, when applied, does not vary considerably (e.g. <0.1 V) across the second electrode surface. Thus, the second electrode thickness is preferably selected based on the second-electrode material resistivity and the expected ionic current through the ion-conducting layer.

The second electrode may be a uniform layer (e.g., FIG. 1A) or a non-uniform layer. The thickness of the second electrode may be less than 100 μm or less than 10 μm. In various embodiments, the thickness of the second electrode is about 1, 5, 10, 20, 30, 40, 50, 75, 100, or 200 μm.

Each electrode is typically connected to an electrical lead fabricated from an electrically conductive material. A lead is an electrical connection consisting of a length of wire, metal pad, metal trace, or other electrically conductive structure. Leads are used to transfer power and may also provide physical support and potentially provide a heat sink. In some embodiments, a device is provided without such leads, which may be added at a later time, before use.

A number of variations of the device are possible.

The vapor cell may be situated inside a magnetic field. Coils of wire driven in an anti-Helmholtz configuration surrounding the vapor cell can be used to generate the magnetic fields required for the trap. Other magnetic-field sources (such as magnets or materials capable of generating magnetic flux) may be utilized to generate magnetic fields within the vapor-cell region. The magnetic-field source may be provided separately from the vapor cell, and these components may be assembled and disassembled from each other for various reasons.

The vapor cell may be contained within an oven. The purpose of the oven may be to control the temperature of the vapor cell at a temperature above the ambient temperature, for example. In principle, the vapor cell may be contained within any sort of temperature-controlled system, for heating or cooling the vapor cell.

A vapor-cell oven enables independent control over the alkali or alkaline earth partial pressure and an optional buffer gas partial pressure in the vapor cell. In some embodiments, the buffer gas partial pressure is controlled by the oven temperature and the alkali or alkaline earth partial pressure is controlled by the voltage and current applied across the solid electrolyte (ion-conducting layer). As conditions in the vapor cell change over time, the oven temperature and alkali or alkaline earth partial pressure can be adjusted to maintain a narrow, stable absorption peak. Because the alkali or alkaline earth concentration may be adjusted after the vapor cell is sealed, precision loading of alkali or alkaline earth metal is not necessary, thus making the sealing process significantly easier.

The system may include one or more heaters to provide heat and thus temporarily increase the ionic conductivity of the ion-conducting layer. The heater is preferably a resistive heater, but may also be a thermoelectric heater, for example. The heater may be patterned directly on the ion-conducting layer, or on another part of the device. The heater may also be attached to a part of the device, or otherwise in thermal or electromagnetic communication (e.g., for induction heating) with the device.

The device may be implemented at a wide variety of length scales. The length scale may be characterized by the cube root of the vapor chamber volume. This length scale may vary from 10 m to 1 nm, with 1 m to 10 mm being typical for macroscale atomic timing and navigation systems, and 10 mm to 10 microns being typical for chip-scale atomic timing and navigation systems.

Chip-scale devices are preferably constructed using microfabrication techniques, including some or all of lithography, evaporation, shadow-masking, evaporation, sputtering, wafer bonding, die bonding, anodic bonding, glass frit bonding, metal-metal bonding, and etching.

Multiple ionic conductors, each with their own electrodes, may be present in a single device. Multiple first electrodes may or may not be electrically connected through electrical leads or electrical traces. Likewise, multiple second electrodes may or may not be electrically connected through electrical leads or electrical traces.

Multiple sets of first electrodes, ion-conducting layers, and second electrodes may generally be present.

In some embodiments, two or more front electrodes are employed. In these or other embodiments, two or more back electrodes are employed. In any of these embodiments, or other embodiments, two or more ion conductors are employed.

While at least one of these first electrodes satisfies the requirements described above, the other electrodes present may be conventional electrodes such as a thin platinum grid. Dielectric materials may be employed to isolate and electrically insulate the electrodes from other parts of the system.

One or more of the second electrodes may contain an alternate source of replacement ions for the ion-conducting layer. The alternate source of replacement ions may be a metal (e.g. silver), an ion-containing species (e.g. a salt), an intercalated compound (e.g. Rb intercalated into graphite), an intermetallic (e.g. gold and rubidium), or a solid or liquid elemental form of an alkali metal or an alkaline earth metal.

It is preferable that an intercalation compound (e.g. Rb intercalated into graphite) is a substantial portion of the second electrode. In the case of a solid or liquid alkali metal second electrode, the alkali metal may be capped with a non-reacting layer such as Pt to seal in the alkali metal and prevent corrosion and/or oxidation.

When a potential is applied across a first electrode and a paired second electrode which contains an alternate source of replacement ions such that the first electrode is at a lower electrical potential than the second electrode, metal ions in the ion-conducting layer between the electrodes will migrate (i.e. conduct) towards the first electrode. They will be replaced by the replacement ions at the second electrode. This prevents the depletion of ions in the ion-conducting layer near the second electrode, thus preventing the charging of a pseudocapacitor which would otherwise require increasing electrical potential to transport more ions. However, this does contaminate the ion-conducting layer with the make-up replacement ions.

In some embodiments, one or more of the second electrodes are configured to enable an electrochemical capacitor. It is preferable to configure such electrodes such that they contact as large of an area as possible of the ion-conducting layer, to increase the electrochemical pseudocapacitance. For instance, the ion-conducting layer may have a roughened, etched, trenched, crenulated, or ridged second surface to increase the contact area between itself and the second electrode(s).

The vapor cell may also contain an atom chip for intra-system generation of magnetic fields for microtraps. The atom chip and the solid electrolyte need not be the same size. An atom chip may be disposed on a different vapor cell face from the solid electrolyte (ion-conducting layer). An atom chip may be fabricated on a base chip that is heterogeneously integrated with the solid electrolyte on the same vapor cell face. The atom chip may be closer to the vapor cell volume than the solid electrolyte, in which case the vapor atoms may pass around the edges of the atom chip or through one of more holes in the atom chip, for example.

The solid electrolyte may be closer to the vapor cell than the atom chip, in which case the trapped population of cold atoms may be situated above the solid electrolyte.

An atom chip may be fabricated directly on the solid electrolyte or on the first electrode. The atom chip traces that generate the magnetic fields for microtraps may be adjacent to the top electrode traces in this case. The atom chip traces that generate the magnetic fields for microtraps may be separated from the ion-conducting layer by a material which is both an electronic insulator and an ionic insulator (e.g., certain glass materials).

One or more of the second (back) electrodes may be in contact with a reservoir volume. The reservoir volume may be hermetically sealed or may be in fluid communication with a larger system. The larger system, for example, could be part of a high-vacuum system containing pumps, pressure/vacuum gauges, atom dispensers, getters, getter pumps, getter sources, pill sources, etc. The reservoir volume may contain alkali metal or alkaline earth metal in a vapor phase, a solid phase, and/or a liquid phase. The reservoir overcomes the problem of a loss of metal atom vapor over time, replacing atoms that irreversibly adsorb onto or diffuse into the walls, for example.

U.S. patent application Ser. No. 14/879,510 entitled "VAPOR CELLS WITH ELECTRICAL CONTROL OF VAPOR PRESSURE, AND METHODS OF USING THE VAPOR CELLS" filed Oct. 9, 2015 (commonly owned with the present patent application) is hereby incorporated by reference herein for its disclosure about reservoir regions that may be utilized in the vapor-cell system of this invention, in certain embodiments.

When a reservoir region is present, the reservoir region also contains an alkali metal (e.g. Na, K, Cs, or Rb) and/or an alkaline earth metal (e.g., Be, Mg, Ca, or Sr). The reservoir region and the vapor-cell region preferably contain the same alkali or alkaline earth metal atoms, but that is not necessary.

The reservoir region should be capable of vapor isolation from the vapor-cell region. By "capable of vapor isolation" as intended herein, it is meant that the vapor-cell region and the reservoir region can be configured such that vapor cannot freely flow (by convection or diffusion, referred to herein individually or collectively as "vapor communication") between the vapor-cell region and the reservoir region. In some embodiments, a reservoir region is designed such that it is not ever in vapor communication with the vapor-cell region—unless there is some sort of leak or structural damage to the system. In certain embodiments, a closable valve is placed between the vapor-cell region and the reservoir region. In such embodiments, when the valve is optionally opened, the vapor-cell region and the reservoir region will temporarily be in vapor communication. However, the valve (if present) is normally closed, making the reservoir region in vapor isolation from the vapor-cell region.

In some embodiments, the concentration of the alkali or alkaline earth metal in the reservoir region is greater than that of the vapor-cell region. In these or other embodiments, the volume of the reservoir region is smaller than that of the vapor-cell region. The total number of atoms of alkali or alkaline earth metal in the reservoir region may be larger or smaller than the total number of atoms of alkali or alkaline earth metal in the vapor-cell region. The alkali or alkaline earth metal atoms in the reservoir region are preferably in the vapor phase, but they may also be present in a liquid phase and/or a solid phase contained in the reservoir region. Optionally, the temperature and concentration of the vapor-cell alkali or alkaline earth metal are selected to ensure atoms of the vapor-cell alkali or alkaline earth metal are essentially in the vapor phase.

Walls enclose the reservoir region, sealing it from the ambient environment. The walls may be fabricated from silicon, $SiO_2$, fused silica, quartz, pyrex, metals, dielectrics, or a combination thereof, for example. Optionally, at least one of the walls includes a substantially transparent portion such that there is an optical path through the reservoir region.

The reservoir region may be contained within an oven which can control the temperature of the vapor-cell reservoir. In some embodiments, the vapor-cell region is contained in an oven while the reservoir region is not, or is contained in a different thermal zone. In other embodiments, the reservoir region is contained in an oven while the vapor-cell region is not.

In some embodiments, a second solid electrolyte is connected between either the vapor cell and the ambient or the reservoir and the ambient. There are two electrodes associated with this second solid electrolyte, one on each side. This second solid electrolyte could be used to load alkali or alkaline earth metal into the vapor-cell region or into the reservoir region. The alkali or alkaline earth loading operation may be done at the beginning of the life of the vapor-cell system. The alkali or alkaline earth loading operation may be repeated periodically through the life of the vapor-cell system. This loading operation is easier than loading a precise amount of alkali or alkaline earth vapor into an unsealed vapor cell and then sealing the vapor cell. An impermeable (or reduced permeability) layer may be placed over the solid electrolyte after loading to eliminate or reduce the diffusion of alkali or alkaline earth vapor out of the vapor-cell region and/or out of the reservoir region.

The system may be configured to allow a secondary optical path through the reservoir region. Multiple laser beams may be employed, or the beam of a single laser may be split to interrogate both the primary and secondary optical paths. The difference in absorption between the two paths may be used to sense the difference in alkali or alkaline earth vapor pressure between the two chambers. If the alkali or alkaline earth in the reservoir is in a vapor-liquid or solid-vapor equilibrium, then the vapor pressure in the reservoir is known if the temperature of the reservoir is known. Thus, the vapor pressure of the alkali or alkaline earth in the vapor cell may be determined by knowing the difference in absorption between the two optical paths and the temperature of the reservoir.

In some embodiments, the reservoir alkali or alkaline earth metal is present at a higher molar concentration in the reservoir region than the molar concentration of the vapor-cell alkali or alkaline earth metal in the vapor-cell region. The volume of the reservoir region is typically (but not necessarily) less than the volume of the vapor-cell region.

In some embodiments, the system further comprises an additional solid electrolyte disposed in ionic communication between the vapor-cell region and an external source of alkali or alkaline earth metal, for initial or periodic loading of the vapor-cell region with the vapor-cell alkali or alkaline earth metal. In these or other embodiments, the system may include another solid electrolyte disposed in ionic communication between the reservoir region and an external source of alkali or alkaline earth metal, for initial or periodic loading of the reservoir region with the reservoir alkali or alkaline earth metal. The polarity of the voltage may be selected to control direction of alkali or alkaline earth atom flux, either from the reservoir region into the vapor-cell region, or from the vapor-cell region into the reservoir region. The amplitude of the voltage may be selected to control magnitude of alkali or alkaline earth atom flux.

The system may include a membrane which deflects as the pressure inside the vapor cell changes. The deflection could be read out with an electrical signal (e.g. piezoelectric, capacitive, differential capacitive, etc.). The membrane could deflect as the pressure between the vapor cell and a reference cell changes. The reference cell may contain vacuum or may contain a substance in vapor-solid or vapor-liquid equilibrium such that the pressure inside the reference cell would be known by knowing the temperature of the reference cell.

Reference is now made to the accompanying drawings, which should not be construed as limiting the invention in any way, but will serve to illustrate various embodiments.

FIG. 1A is a schematic of an exemplary vapor cell, in some embodiments. In FIG. 1A, a single-layer intercalable-compound first (front) electrode is disposed in contact with the vapor-cell region. A single-layer second (back) electrode is electrically isolated from the first electrode. The second electrode is optionally also an intercalable-compound electrode. The first and second electrodes may include graphite particles in a binder matrix, for example. An ion-conducting layer is interposed between the first electrode and the second electrode. The second electrode is in contact with a reservoir region containing metal atoms. FIG. 1A shows laser beams traversing three optical paths in the vapor cell and trapping a population of cold atoms. In some embodiments, the three optical paths are orthogonal to each other. FIG. 1A is a two-dimensional flattened projection of three orthogonal laser paths in three dimensions. An optional magnetic field source and resulting magnetic field lines, which also play a role in the trapping of atoms, are not depicted in this sketch.

Figure 1B:
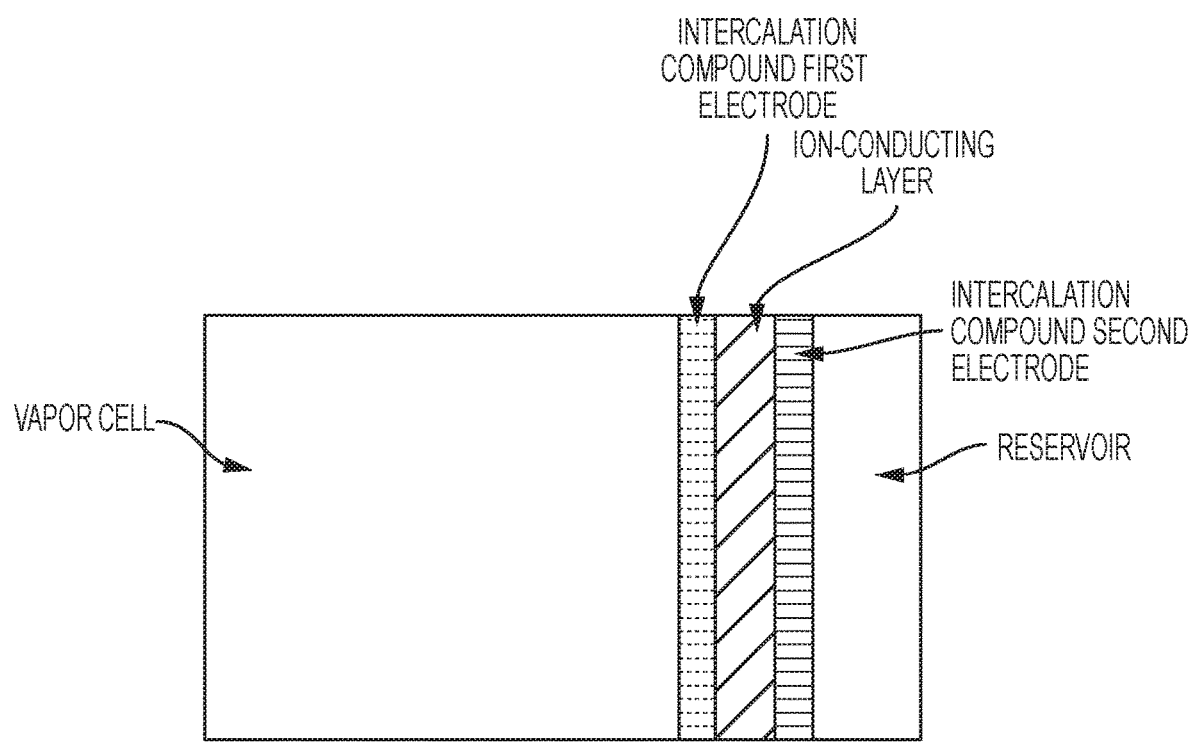
FIG. 1B is a schematic of an exemplary vapor cell, identical to FIG. 1A, except that laser beams are not shown.

FIG. 1B is identical to FIG. 1A, except that the laser beams are not shown. It shall be understood that laser beams may or may not be present in any vapor cell described in this specification. That is, a source of laser beams may be present but not operating, in which case no laser beams will enter or be present within the vapor-cell region. Or a vapor cell may be provided without a source of laser beams, which source may be added at a later time, prior to operation of the vapor-cell system. In any event, the laser beams can be omitted from the drawings for clarity, it being understood that laser beams may be present. The remaining drawings (FIGS. 2-13) do not explicitly depict laser beams or optical paths, it being understood that that laser beams may or may not be actually present, analogous to FIGS. 1A/1B. Likewise, magnetic field sources (external to the device) and magnetic field lines (within the device) are not depicted in the drawings, to aid in the depiction of device features and because the magnetic field sources and lines may or may not be actually present.

Figure 2:
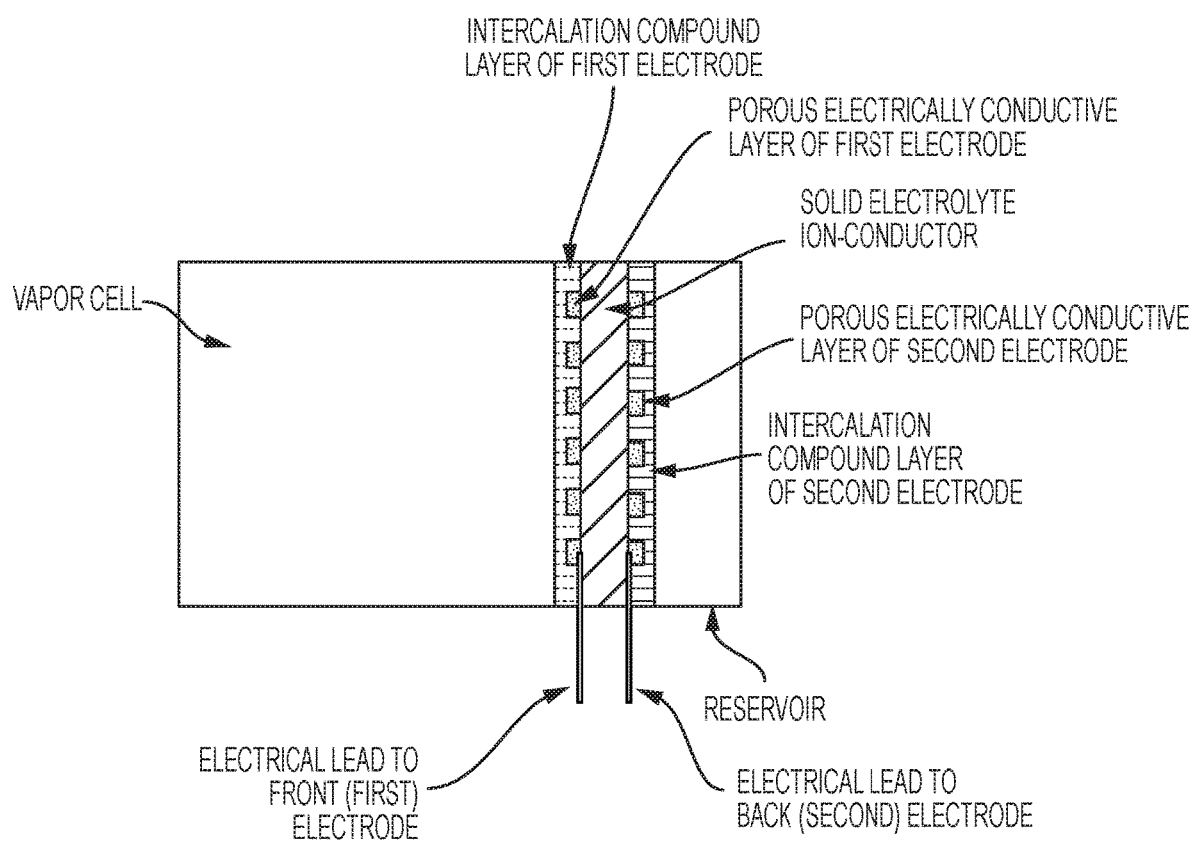
FIG. 2 is a schematic of an exemplary vapor cell, in some embodiments, with a dual-layer first (front) electrode (intercalable-compound layer and porous electrically conductive layer) and a dual-layer second (back) electrode (intercalable-compound layer and porous electrically conductive layer).

FIG. 2 is a schematic of an exemplary vapor cell, in some embodiments. In FIG. 2, a dual-layer first (front) electrode includes an intercalable-compound layer and a porous electrically conductive layer. In addition, a dual-layer second (back) electrode includes an intercalable-compound layer and a porous electrically conductive layer. The porous electrically conductive layers preferably have electrical resistivity less than $10^{-3}$ $\Omega\cdot cm$, more preferably less than $10^{-4}$ $\Omega\cdot cm$, measured at 25° C. The porous electrically conductive layers may be thin (e.g., less than 200 nm) Pt meshes, for example. This may allow the desirable property that an electrical potential, when applied, does not vary considerably (e.g., <0.1 V) across the electrode surface. The first and second electrodes may include graphite particles in a binder matrix, for example. An ion-conducting layer is interposed between the first electrode and the second electrode. The second electrode is in contact with a reservoir region containing metal atoms.

Figure 3:
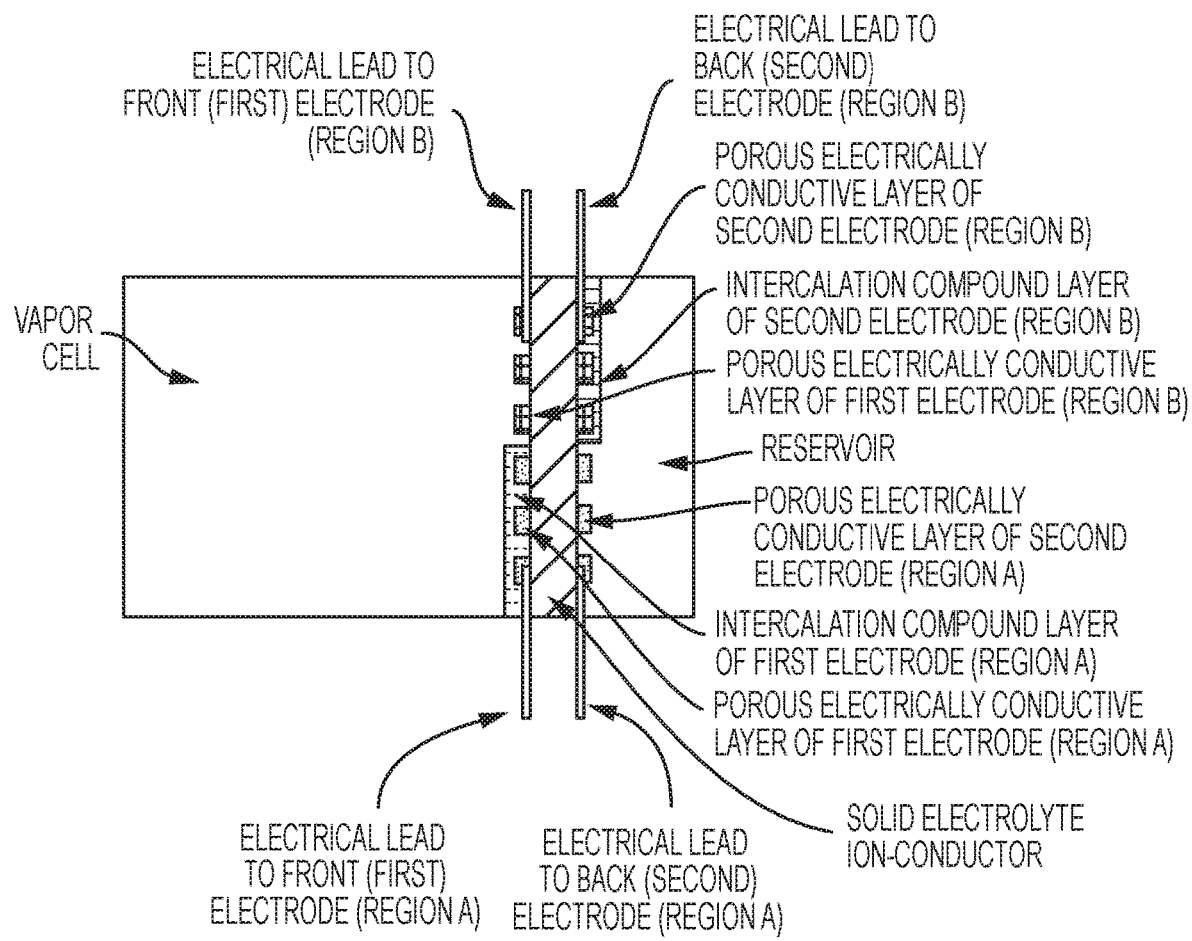
FIG. 3 is a schematic of an exemplary vapor cell, in some embodiments, with two pairs of electrodes, in region A and region B.

FIG. 3 is a schematic of an exemplary vapor cell, in some embodiments. In FIG. 3, there are two pairs of electrodes, in region A and in region B. Regions A and B are ionically connected via a common solid electrolyte ion-conductor. Region A is configured for reducing the vapor pressure of the vapor cell, by including an intercalation compound layer on the side facing the vapor-cell region. Region B is configured for increasing the vapor pressure of the vapor cell, by including an intercalation compound layer on the opposite side that faces the reservoir region. An ion-conducting layer is interposed between the first electrode and the second electrode. The second electrode is in contact with a reservoir region containing metal atoms.

Figure 4:
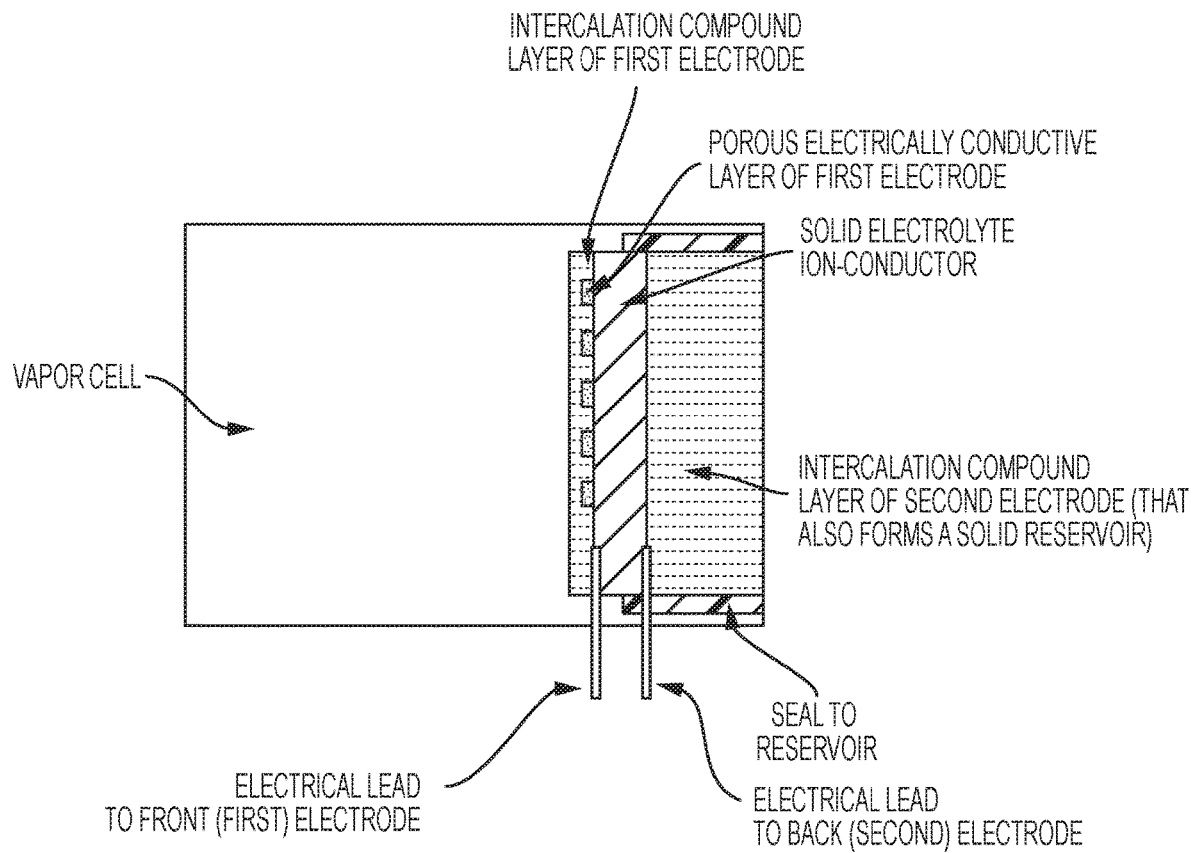
FIG. 4 is a schematic of an exemplary vapor cell, in some embodiments, with a reservoir combined with a second electrode that includes a thick intercalable-compound layer (e.g., graphite layer).

FIG. 4 is a schematic of an exemplary vapor cell, in some embodiments. In FIG. 4, there is no vapor region in the reservoir. Rather, the reservoir is combined with the second electrode and includes a thicker intercalable-compound layer (e.g., graphite layer). An ion-conducting layer is interposed between the first electrode and the second electrode (which also functions as a solid reservoir).

Figure 5:
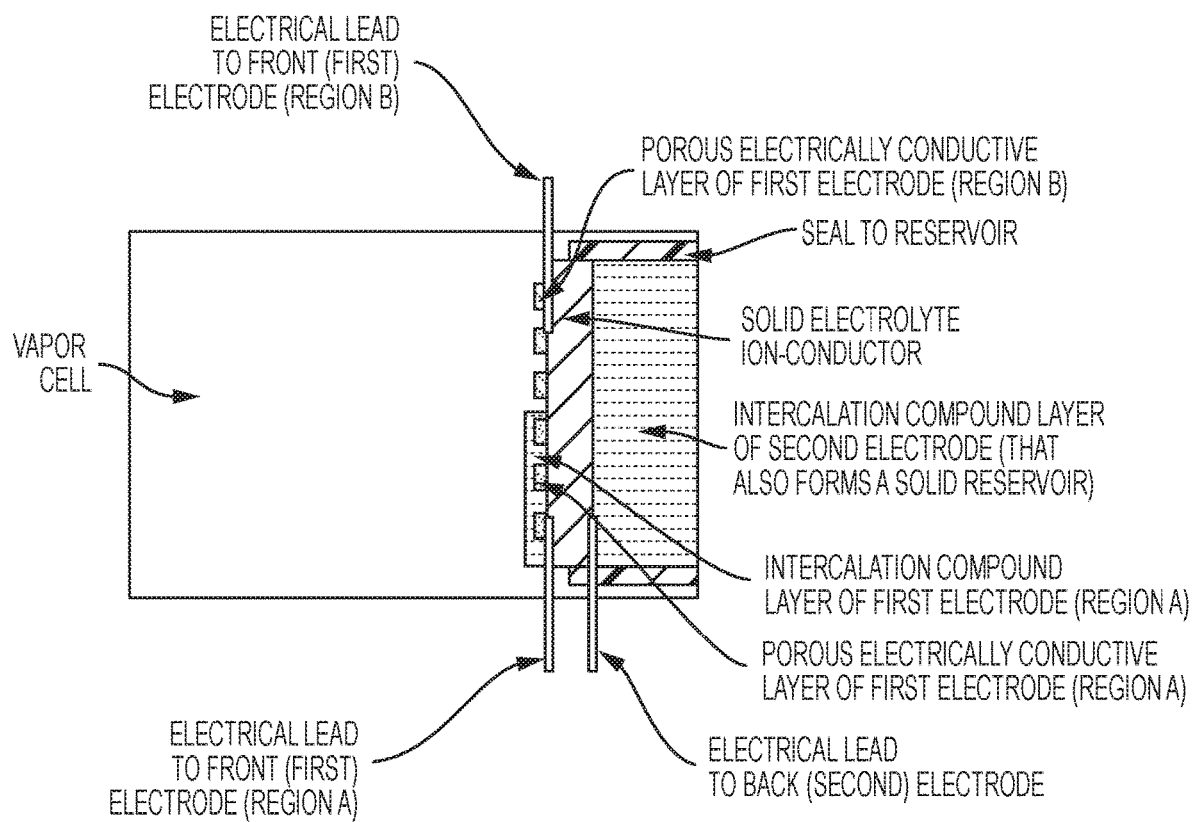
FIG. 5 is a schematic of an exemplary vapor cell, in some embodiments, with a reservoir combined with a second electrode that includes a thick intercalable-compound layer and two pairs of electrodes (region A and region B).

FIG. 5 is a schematic of an exemplary vapor cell, in some embodiments. In FIG. 5, there is no vapor region in the reservoir. Rather, the reservoir is combined with the second electrode and includes a thicker intercalable-compound layer (e.g., graphite layer). An ion-conducting layer is interposed between the first electrode and the second electrode (which also functions as a solid reservoir). Additionally, in this variation, there are two pairs of electrodes (region A and region B). Region A is configured for reducing the vapor pressure of the vapor cell, by including an intercalation compound layer on the side facing the vapor-cell region. Region B is configured for increasing the vapor pressure of the vapor cell, by including an intercalation compound layer on the opposite side that also forms a solid reservoir region.

Figure 6:
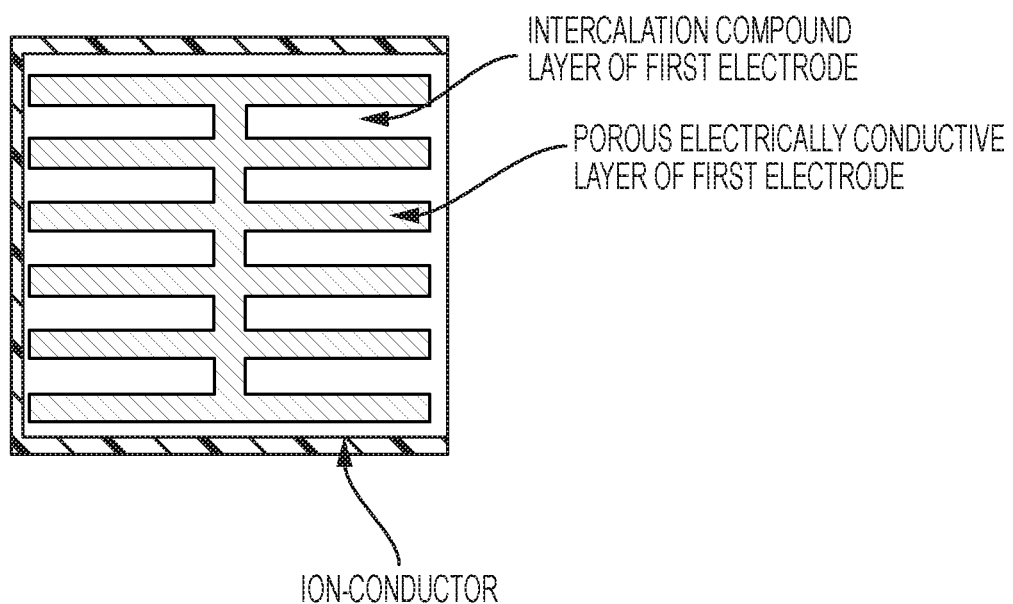
FIG. 6 is a plan-view schematic of a dual-layer electrode disposed on an ion-conducting layer, in some embodiments.

FIG. 6 is a plan-view schematic of a dual-layer electrode disposed on an ion-conducting layer, in some embodiments.

Figure 7:
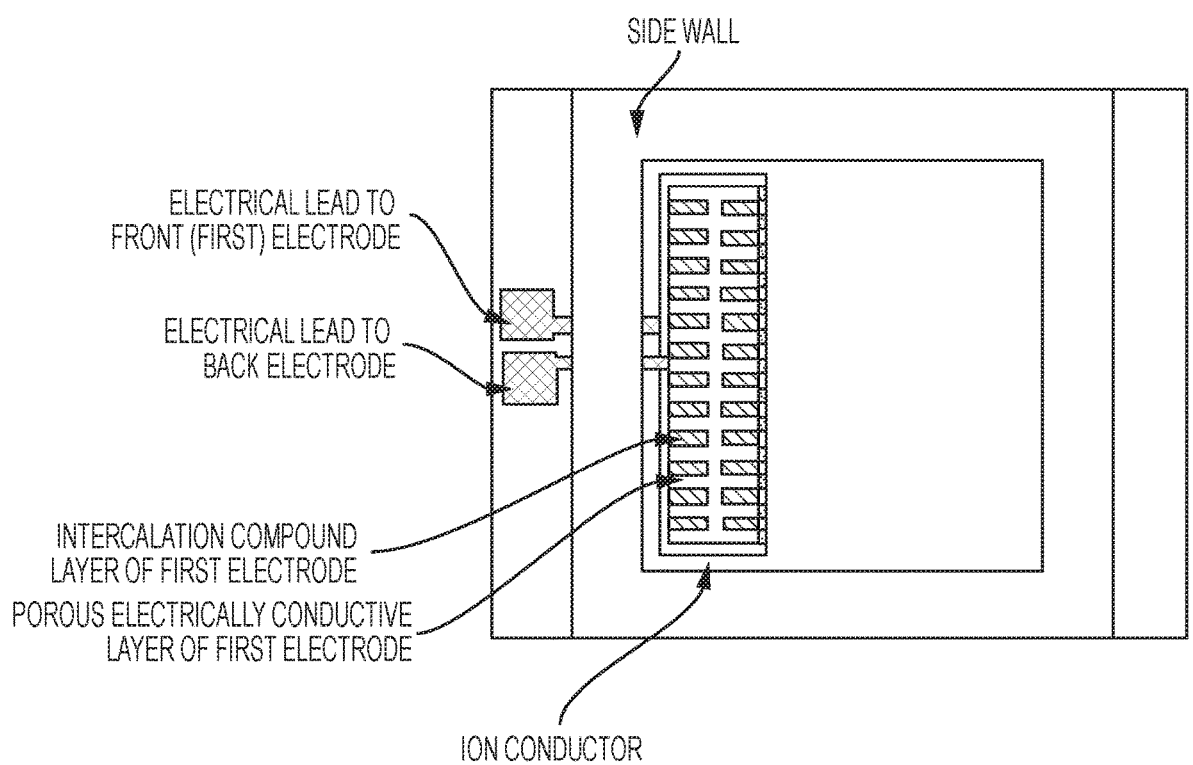
FIG. 7 is a plan-view schematic of a chip-scale variation of the invention, in some embodiments.

FIG. 7 is a plan-view schematic of a chip-scale variation of the invention, in some embodiments.

Figure 8:
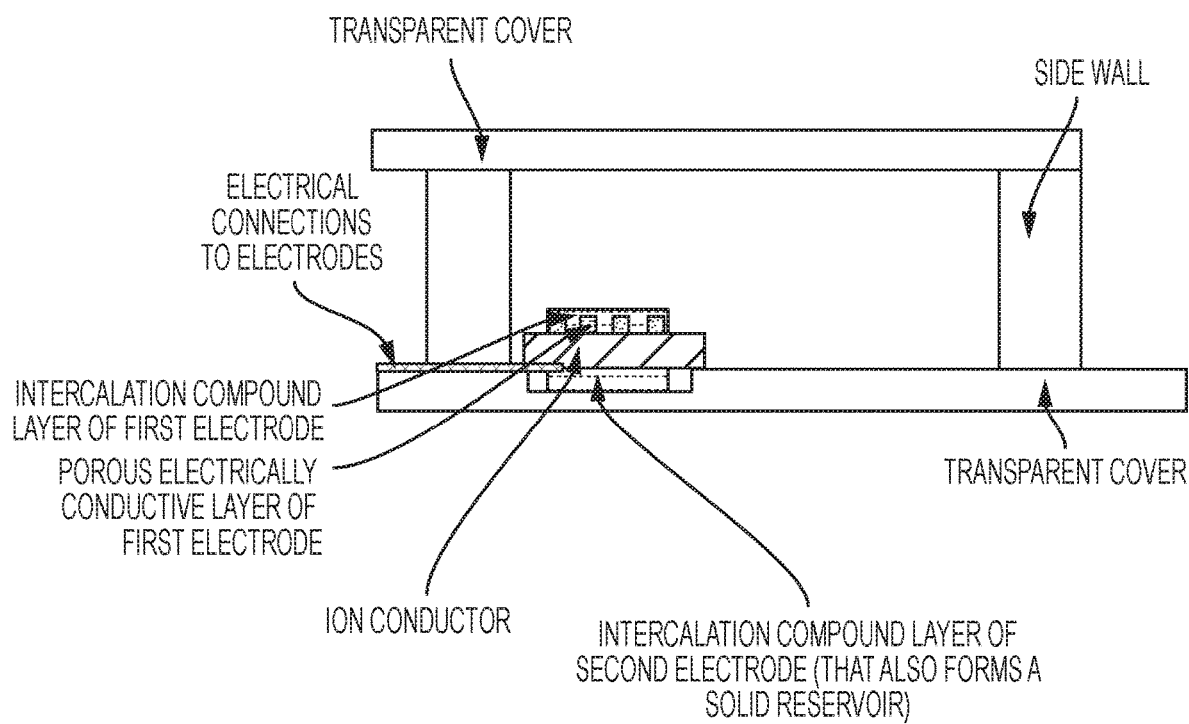
FIG. 8 is a side-view schematic of a chip-scale variation of invention, in some embodiments.

FIG. 8 is a side-view schematic of a chip-scale variation of invention, in some embodiments.

Figure 9:
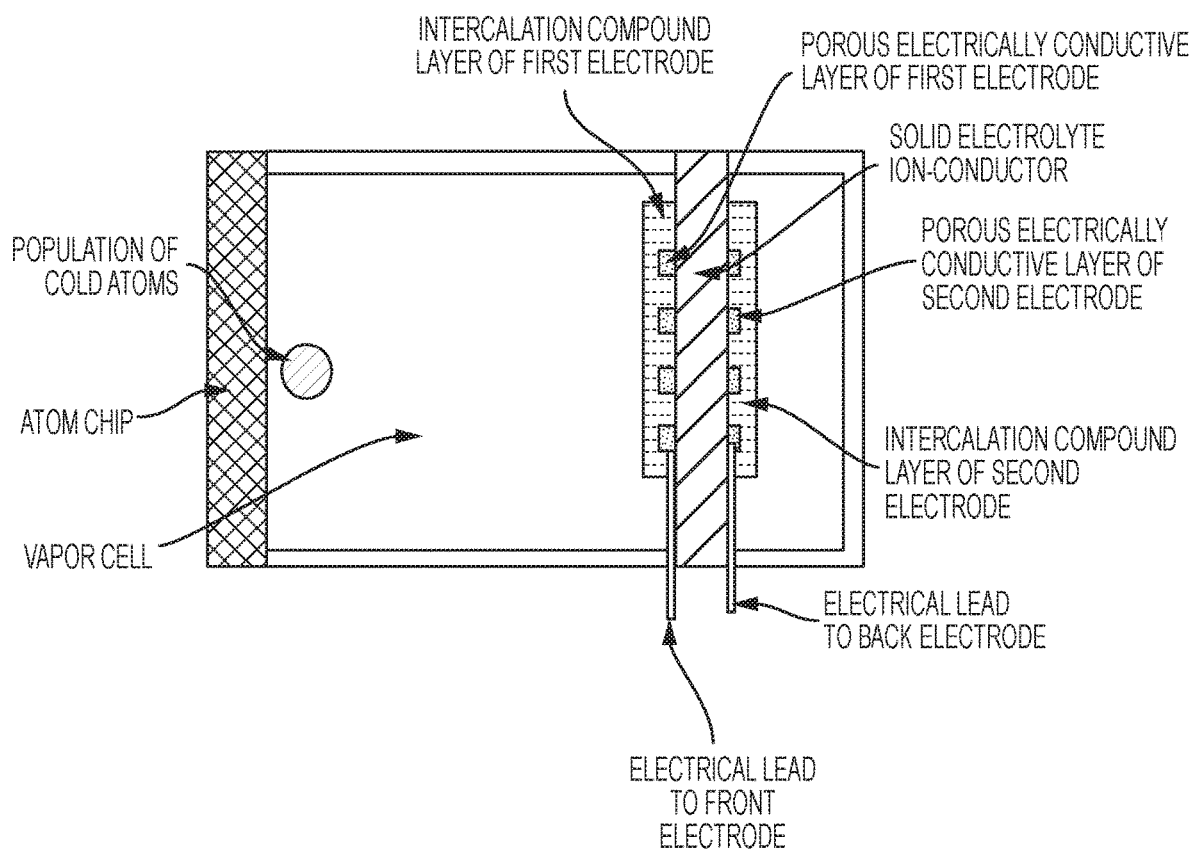
FIG. 9 is a schematic of the invention, in some embodiments, integrated with an atom chip at the package level.

FIG. 9 is a schematic of the invention, in some embodiments, integrated with an atom chip at the package level.

Figure 10:
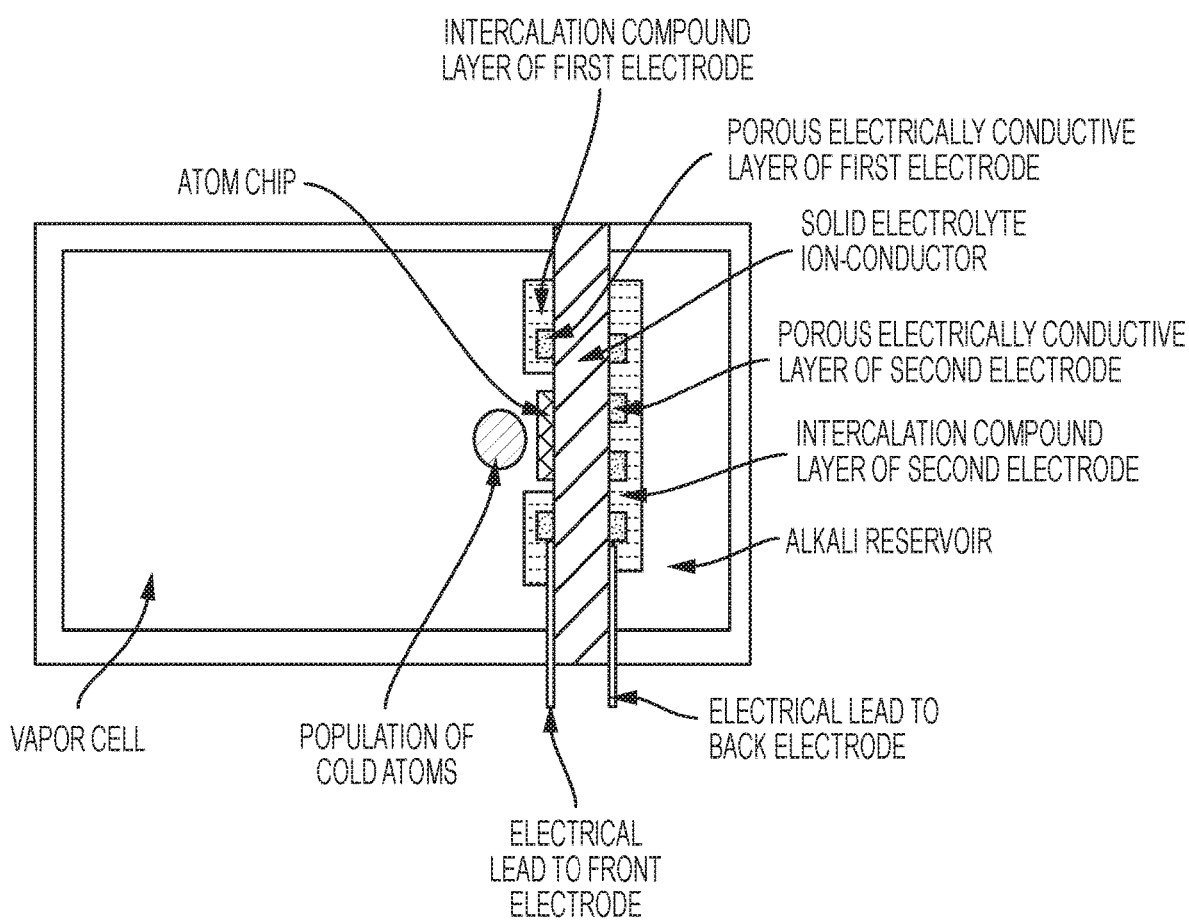
FIG. 10 is a schematic of the invention, in some embodiments, with an atom chip heterogeneously integrated with the solid electrolyte ion-conductor.

FIG. 10 is a schematic of the invention, in some embodiments, with an atom chip heterogeneously integrated with the solid electrolyte ion-conductor.

Figure 11:
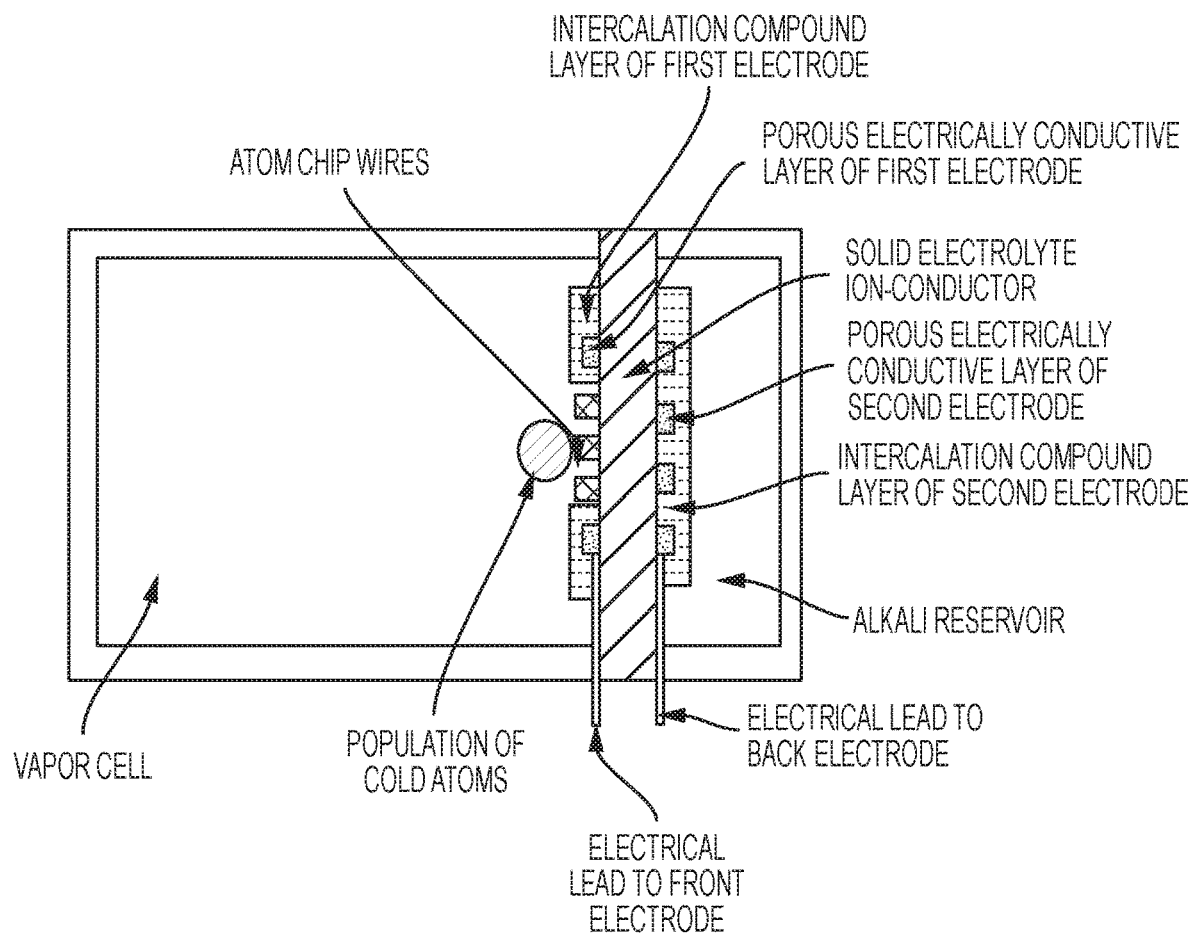
FIG. 11 is a schematic of the invention, in some embodiments, with an atom chip fully integrated with one of solid electrolyte ion conductor.

FIG. 11 is a schematic of the invention, in some embodiments, with an atom chip fully integrated with one of solid electrolyte ion conductor. In this case, the atom chip electrical traces are patterned with the ion-conducting membrane as a substrate.

Figure 12:
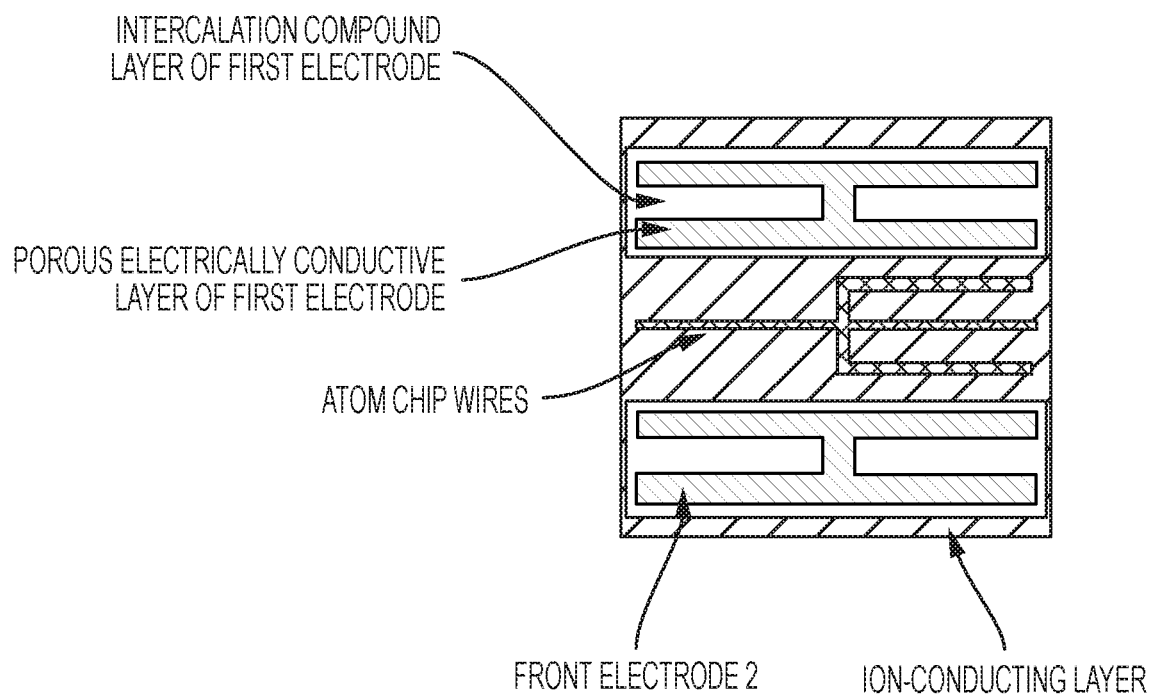
FIG. 12 is a plan-view schematic of electrodes and atom chip wires on an ion conductor in some embodiments of this invention, with an atom chip fully integrated with the ion conductor.

FIG. 12 is a plan-view schematic of electrodes and atom chip wires on an ion conductor in some embodiments of this invention, with an atom chip fully integrated with the ion conductor.

Figure 13:
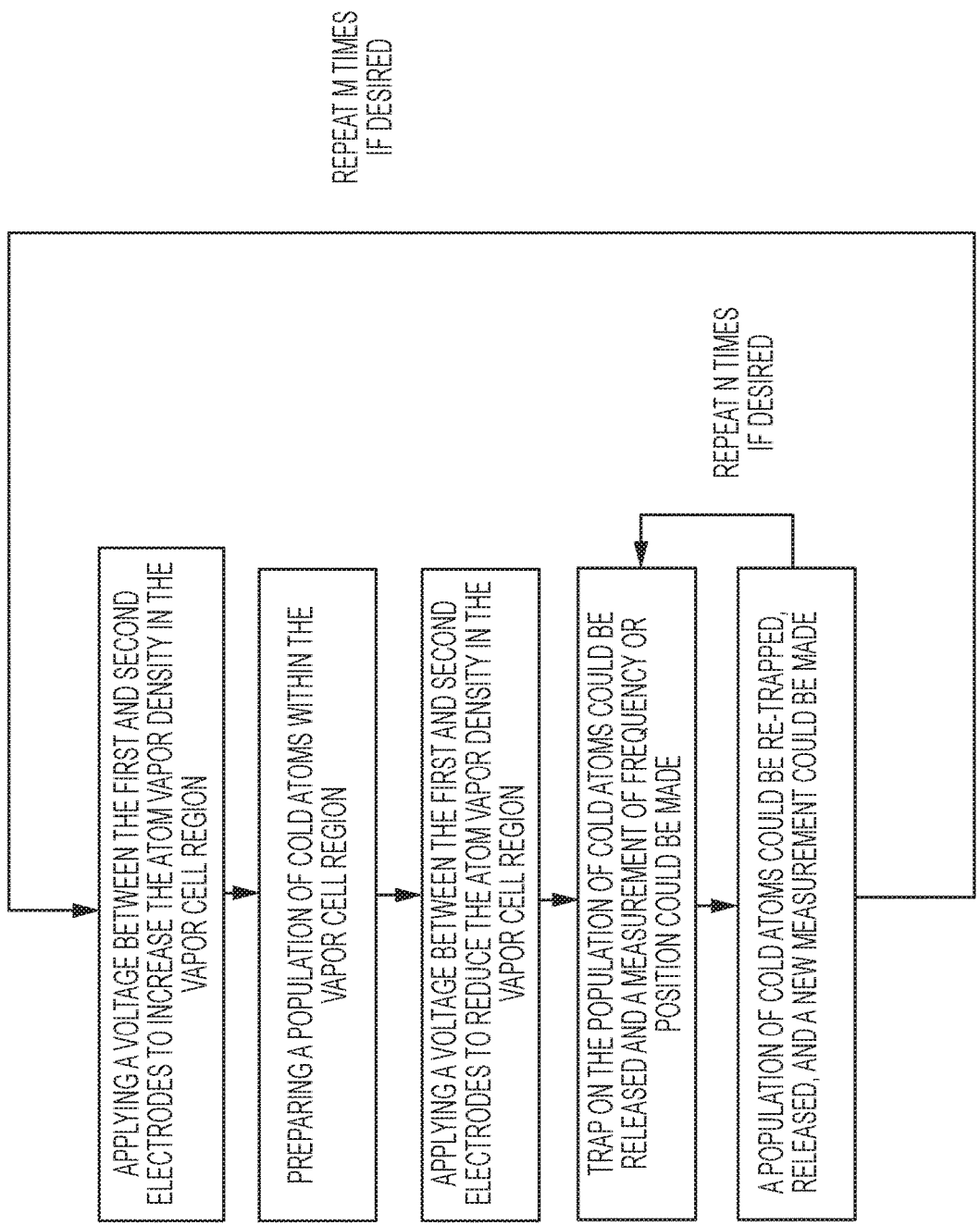
FIG. 13 is an exemplary schematic of a method (process flowchart) of the invention, according to some embodiments.

FIG. 13 is an exemplary schematic of a method (process flowchart) of the invention, according to some embodiments.

Some variations of the invention provide methods for operating a device described herein. Some methods include the following steps or configurations.

In some embodiments, a voltage is applied between the first and second electrodes to reduce the atom vapor density in the vapor-cell region (e.g., evacuate some or all of the alkali atoms from the vapor cell). The voltage is applied such the second electrode has a lower electrical potential than the first electrode. This causes mobile ions within the solid electrolyte to conduct towards the second electrode. At the interface between the intercalable compound and the solid electrolyte, intercalated atoms from the intercalable compound are ionized, electrons conduct through the first electrode, and ions conduct through the solid electrolyte. This creates a concentration gradient of intercalated atoms in the intercalation compound in the first electrode, thus causing intercalated atoms to diffuse toward the solid electrolyte and away from the interface between the first electrode and the vapor-cell region. As atoms diffuse away from the interface between the first electrode and the vapor-cell region, the intercalable compound will getter additional atoms from the vapor phase, thus reducing the number of atoms in the vapor phase in the vapor-cell region.

There are multiple options for what occurs at the second electrode. If the second electrode contains an intercalable compound, ions from the solid electrolyte will be neutralized by electrons supplied via the second electrode and the neutral atoms will intercalate into the second electrode material. If there is a reservoir with an atom vapor, ions from the solid electrolyte will be neutralized by electrons supplied via the second electrode, and neutral atoms will desorb from the surface of the ion-conducting layer into the alkali reservoir.

Some embodiments include one or more of the following additional steps or configurations.

A population of cold atoms (e.g., $10^5$ to $10^9$ atoms) at a temperature of, for example, about 1 μK to 1000 μK, may be prepared within the vapor-cell region prior to applying a voltage between the first and second electrodes, to reduce the atom vapor density in the vapor-cell region. This population may be formed with a magneto-optical trap.

A voltage may be applied between the first and second electrodes to increase the atom vapor density in the vapor-cell region prior to preparing a population of cold atoms within the vapor-cell region. The voltage is applied such the second electrode has a higher electrical potential than the first electrode. This causes mobile ions within the solid electrolyte to conduct towards the first electrode.

There are multiple options for what occurs at the first electrode. If the first electrode contains an intercalable compound, ions from the solid electrolyte will be neutralized by electrons supplied via the first electrode and the neutral atoms will intercalate into first electrode material. These intercalated atoms will form a concentration gradient in the intercalable compound and diffuse toward the interface of the first electrode and the vapor-cell region. The atoms will then desorb from the surface of the first electrode into the vapor-cell region, thus increasing the atomic density in the vapor-cell region.

If the first electrode does not contain an intercalable compound, then at or near the three-phase boundary of the first electrode, solid electrolyte, and vapor chamber volume, electrons will combine with mobile ions (e.g. $Rb^+$, $Cs^+$, $Na^+$, $K^+$, and/or $Sr^{2+}$) to create neutral atoms (e.g. Rb, Cs, Na, K, and/or Sr). These neutral atoms will then desorb from the surface into the vapor chamber volume, thus increasing the vapor density or vapor pressure in the vapor chamber volume.

There are multiple options for what occurs at the second electrode. If there is a solid source of replacement ions, the replacement ions will enter the ion-conducting layer near the second electrode and prevent the formation of an ion-depletion region. If an ion-blocking electrode is present, then within the solid electrolyte near the second electrode a region partially or fully depleted in mobile ions will form. Immobile ions (e.g. Al—O—$^-$ or $O^{2-}$) will remain. These immobile ions will form a pseudocapacitor balanced by the charge on the second electrode. These charges are physically separated. Metal ion flow will reduce and may eventually stop as more and more of the applied voltage drops across the pseudocapacitor region to maintain the charge separation.

If there is a reservoir with atom vapor and the second electrode does not contain an intercalable material, then metal atoms will adsorb on the ion-conducting layer and/or the second electrode, ionize, and then the metal ions will enter the ion-conducting layer and replace the lost ions. If the second electrode contains an intercalable compound, atoms will diffuse down a concentration gradient in the second electrode away from the interface between the second electrode and the reservoir region, and towards the ion-conducting layer. Atoms will ionize at the interface of the second electrode and ion-conducting layer. Electrons will conduct through the electrode, and ions will conduct through the ion-conducting layer. As atoms diffuse away from the interface between the second electrode and the reservoir region, the intercalable compound will getter additional atoms from the vapor phase.

After reducing the vapor pressure as described above, the trap on the population of cold atoms may be released and a measurement of frequency or position may be made. After the measurement, a population of cold atoms may be re-trapped, released, and a new measurement may be made. This step may be repeated multiple times. The entire cycle of steps could be repeated multiple times (e.g., see FIG. 13).

One or more walls of the vapor chamber volume are substantially transparent at relevant wavelengths such that there is an optical path through the vapor cell volume. It is preferable that there are three orthogonal optical paths to facilitate the formation of a magneto-optical trap (MOT) and for atomic cloud imaging.

Some embodiments provide a magneto-optical trap apparatus, the apparatus comprising:

a vapor-cell region configured to allow three (preferably orthogonal) vapor-cell optical paths within a vapor-cell vapor phase in the vapor-cell region;

a first electrode disposed in contact with the vapor-cell region, wherein the first electrode contains a first intercalable compound;

a second electrode that is electrically isolated from the first electrode; and an ion-conducting layer interposed between the first electrode and the second electrode, wherein the ion-conducting layer is in ionic communication with the second electrode, and wherein the ion-conducting layer is ionically conductive for at least one ionic species selected from the group consisting of $Rb^+$, $Cs^+$, $Na^+$, $K^+$, and $Sr^{2+}$;

optionally (e.g., for purposes of operation or for provided an integrated system) a source of laser beams configured to provide the three orthogonal vapor-cell optical paths through the vapor-cell gas phase, to trap a population of cold atoms; and optionally (e.g., for purposes of operation or for provided an integrated system) a magnetic-field source configured to generate magnetic fields within the vapor-cell region.

The vapor-cell optical paths do not need to be orthogonal when entering the vapor cell. For example, there could be mirrors inside the vapor cell that make them orthogonal only inside the vapor cell. There could be one optical path entering the cell, which optical path is split within the vapor cell. In some embodiments, within the vapor cell, along three different orthogonal axes based on the location of trapped atoms, two optical paths (one in each direction) are located on each of the three axes.

Some embodiments provide an atomic-cloud imaging apparatus, the apparatus comprising:

a vapor-cell region configured to allow one or more (preferably orthogonal when more than one) vapor-cell optical paths within a vapor-cell vapor phase in the vapor-cell region;

a first electrode disposed in contact with the vapor-cell region, wherein the first electrode contains a first intercalable compound;

a second electrode that is electrically isolated from the first electrode; and an ion-conducting layer interposed between the first electrode and the second electrode, wherein the ion-conducting layer is in ionic communication with the second electrode, and wherein the ion-conducting layer is ionically conductive for at least one ionic species selected from the group consisting of $Rb^+$, $Cs^+$, $Na^+$, $K^+$, and $Sr^{2+}$;

optionally (e.g., for purposes of operation or for provided an integrated system) a source of laser beams configured to provide the three orthogonal vapor-cell optical paths through the vapor-cell gas phase, to image a population of cold atoms; and optionally (e.g., for purposes of operation or for provided an integrated system) a magnetic-field source configured to generate magnetic fields within the vapor-cell region.

In this detailed description, reference has been made to multiple embodiments and to the accompanying drawings in which are shown by way of illustration specific exemplary embodiments of the invention. These embodiments are described in sufficient detail to enable those skilled in the art to practice the invention, and it is to be understood that modifications to the various disclosed embodiments may be made by a skilled artisan.

Where methods and steps described above indicate certain events occurring in certain order, those of ordinary skill in the art will recognize that the ordering of certain steps may be modified and that such modifications are in accordance with the variations of the invention. Additionally, certain steps may be performed concurrently in a parallel process when possible, as well as performed sequentially.

All publications, patents, and patent applications cited in this specification are herein incorporated by reference in their entirety as if each publication, patent, or patent application were specifically and individually put forth herein.

The embodiments, variations, and figures described above should provide an indication of the utility and versatility of the present invention. Other embodiments that do not provide all of the features and advantages set forth herein may also be utilized, without departing from the spirit and scope of the present invention. Such modifications and variations are considered to be within the scope of the invention defined by the claims.

What is claimed is:

1. A vapor-cell system comprising:
    a vapor-cell region configured to allow at least one vapor-cell optical path into a vapor-cell vapor phase within said vapor-cell region;
    a first electrode disposed in contact with said vapor-cell region;
    a second electrode that is electrically isolated from said first electrode, wherein said second electrode contains an intercalable compound; and an ion-conducting layer interposed between said first electrode and said second electrode, wherein said ion-conducting layer is in ionic communication with said second electrode, and wherein said ion-conducting layer is ionically conductive for at least one ionic species.

2. The vapor-cell system of claim 1, wherein said intercalable compound is a carbonaceous material selected from the group consisting of graphite, graphene, carbon nanotubes, fullerenes, activated carbon, coke, pitch coke, petroleum coke, carbon black, amorphous carbon, glassy carbon, pyrolyzed carbon-containing molecules, pyrolyzed parylene, polyaromatic hydrocarbons, and combinations thereof.

3. The vapor-cell system of claim 2, wherein said carbonaceous material comprises graphite.

4. The vapor-cell system of claim 2, wherein said carbonaceous material comprises pyrolyzed parylene.

5. The vapor-cell system of claim 1, wherein said intercalable compound is a transition-metal oxide, a transition-metal dichalcogenide, or a combination thereof.

6. The vapor-cell system of claim 1, wherein said at least one ionic species is selected from the group consisting of $Rb^+$, $Cs^+$, $Na^+$, $K^+$, and $Sr^{2+}$.

7. The vapor-cell system of claim 1, wherein said intercalable compound is intercalative for at least one element selected from the group consisting of Rb, Cs, Na, K, and Sr.

8. The vapor-cell system of claim 1, wherein said ion-conducting layer contains at least one ionic species selected from the group consisting of $Rb^+$, $Cs^+$, $Na^+$, $K^+$, and $Sr^{2+}$.

9. The vapor-cell system of claim 8, wherein said intercalable compound is intercalated by a neutral form of said at least one ionic species selected from the group consisting of $Rb^+$, $Cs^+$, $Na^+$, $K^+$, and $Sr^{2+}$.

10. The vapor-cell system of claim 1, wherein said vapor-cell region contains a vapor phase comprising metal atoms that are intercalable in said intercalable compound.

11. The vapor-cell system of claim 10, wherein said metal atoms are selected from the group consisting of Rb, Cs, Na, K, Sr, and combinations thereof, wherein said ion-conducting layer contains at least one ionic species selected from the group consisting of $Rb^+$, $Cs^+$, $Na^+$, $K^+$, and $Sr^{2+}$, and wherein said metal atoms are the same element as said at least one ionic species.

12. The vapor-cell system of claim 1, wherein said ion-conducting layer comprises β-alumina, β″-alumina, yttria-stabilized zirconia, NASICON, LISICON, KSICON, or combinations thereof.

13. The vapor-cell system of claim 1, wherein said second electrode is in contact with a reservoir region containing alkali or alkaline earth metal atoms.

14. The vapor-cell system of claim 1, said system further comprising an atom chip.

15. The vapor-cell system of claim 1, said system further comprising electrical traces physically located on, but electrically insulated from, said ion-conducting layer.

16. The vapor-cell system of claim 1, wherein said vapor-cell system is configured to allow three vapor-cell optical paths within said vapor-cell vapor phase.

17. The vapor-cell system of claim 1, wherein said vapor-cell system further includes a heater attached to said vapor-cell system, or in thermal or electromagnetic communication with said vapor-cell system.

18. A magneto-optical trap apparatus, said apparatus comprising:
 a vapor-cell region configured to allow at least one vapor-cell optical path into a vapor-cell vapor phase within said vapor-cell region;
 a first electrode disposed in contact with said vapor-cell region;
 a second electrode that is electrically isolated from said first electrode, wherein said second electrode contains an intercalation compound that is intercalated by at least one element, in ionic or neutral form; and
 an ion-conducting layer interposed between said first electrode and said second electrode, wherein said ion-conducting layer is in ionic communication with said second electrode, wherein said ion-conducting layer is ionically conductive for at least one ionic species, and wherein said ion-conducting layer contains mobile ions comprising said at least one ionic species.

19. The magneto-optical trap apparatus of claim 18, wherein said at least one element is selected from the group consisting of Rb, Cs, Na, K, and Sr.

20. The magneto-optical trap apparatus of claim 18, wherein said at least one ionic species is selected from the group consisting of $Rb^+$, $Cs^+$, $Na^+$, $K^+$, and $Sr^{2+}$.

* * * * *